(12) United States Patent
Egashira

(10) Patent No.: US 10,831,116 B2
(45) Date of Patent: Nov. 10, 2020

(54) PATTERN FORMING APPARATUS, DECIDING METHOD, STORAGE MEDIUM, INFORMATION PROCESSING APPARATUS, AND ARTICLE MANUFACTURING METHOD

(71) Applicant: CANON KABUSHIKI KAISHA, Tokyo (JP)

(72) Inventor: Shinichi Egashira, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 42 days.

(21) Appl. No.: 16/106,483

(22) Filed: Aug. 21, 2018

(65) Prior Publication Data

US 2019/0064679 A1 Feb. 28, 2019

(30) Foreign Application Priority Data

Aug. 30, 2017 (JP) ................. 2017-166111

(51) Int. Cl.
*G03F 9/00* (2006.01)
*G03F 7/20* (2006.01)

(52) U.S. Cl.
CPC ........ *G03F 9/7092* (2013.01); *G03F 7/70483* (2013.01); *G03F 9/7046* (2013.01); *G03F 9/7073* (2013.01)

(58) Field of Classification Search
CPC .... G03F 9/7073; G03F 9/7003; G03F 9/7007; G03F 9/7038; G03F 9/7042;

(Continued)

(56) References Cited

U.S. PATENT DOCUMENTS 5,525,808 A * 6/1996 Irie ................. G03F 9/7003
250/548
7,373,213 B2 5/2008 Oishi et al.
(Continued)

FOREIGN PATENT DOCUMENTS

| JP | H06151274 A | 5/1994 |
| JP | H08316132 A | 11/1996 |
| JP | 2003324054 A | 11/2003 |

OTHER PUBLICATIONS

Extended European Search Report issued in European Appln. No. 18187817.4 dated Jan. 31, 2019.
Office Action issued in Japanese Appln. No. 2017-166111 dated Apr. 19, 2019. English translation provided.

*Primary Examiner* — Christina A Riddle
(74) *Attorney, Agent, or Firm* — Rossi, Kimms & McDowell LLP

(57) ABSTRACT

The present invention provides a pattern forming apparatus including a detection optical system configured to obtain optical information of a mark provided on a substrate by detecting the mark, and a processing unit configured to perform a process of obtaining a position of the mark by using a template for obtaining the position of the mark by being applied to the optical information of the mark and a window which indicates a region for extracting an amount of characteristic indicating the position of the mark from a waveform signal obtained from the optical information, wherein the processing unit decides, based on the optical information of the mark obtained by the detection optical system, a parameter indicating at least one of a shape of the template and a shape of the window for each of a plurality of substrates.

28 Claims, 17 Drawing Sheets

(58) Field of Classification Search
CPC .... G03F 9/7076; G03F 9/7084; G03F 9/7088;
G03F 9/7092; G03F 7/70591; G03F
7/706; G03F 7/70616; G03F 7/70625;
G03F 7/70633; G03F 7/70641; G03F
7/70666; G03F 7/70675; G03F 7/70683;
G03F 7/70483; G03F 7/70491; G03F
7/70508; G03F 7/70516; G03F 7/70525;
G03F 7/70533; G03F 7/70541; G03F
7/70691; G03F 7/70716; G03F 7/70725
USPC ......... 355/52, 53, 54, 55, 72–77; 250/492.1,
250/492.2, 492.22, 493.1; 356/399–401,
356/614–622, 388, 394, 396; 702/57,
702/66–78, 81, 82, 94, 95, 150, 189–195,
702/198–199
See application file for complete search history.

(56) References Cited

U.S. PATENT DOCUMENTS

| | | | |
|---|---|---|---|
| 2003/0174330 A1 | 9/2003 | Tanaka et al. | |
| 2005/0137837 A1* | 6/2005 | Oishi | G03F 7/705 703/1 |
| 2008/0063956 A1 | 3/2008 | Egashira | |
| 2008/0094642 A1* | 4/2008 | Okita | G03F 9/7092 356/622 |
| 2008/0106714 A1* | 5/2008 | Okita | G03F 7/70633 355/53 |
| 2009/0138135 A1* | 5/2009 | Oishi | G03F 9/7003 700/302 |

* cited by examiner

PATTERN FORMING APPARATUS, DECIDING METHOD, STORAGE MEDIUM, INFORMATION PROCESSING APPARATUS, AND ARTICLE MANUFACTURING METHOD

BACKGROUND OF THE INVENTION

Field of the Invention

The present invention relates to a pattern forming apparatus, a deciding method, a storage medium, an information processing apparatus, and an article manufacturing method.

Description of the Related Art

Along with the progress in microfabrication and integration of devices, an improvement in alignment accuracy is required of a pattern forming apparatus such as an exposure apparatus or an imprint apparatus. In alignment, in general, an alignment mark provided on a substrate to be measured is measured (captured) by a measurement optical system to obtain data (mark image), and the data undergoes image or signal processing by a processing unit, obtaining the position of the alignment mark, that is, the substrate.

At the time of measurement of the alignment mark, however, nonlinear error components may be overlaid due to the influence of a variation in device manufacturing process, the aberration of the measurement optical system, electric noise of the processing unit, or the like, lowering the alignment accuracy. To cope with this, Japanese Patent Laid-Open No. 2003-324054 proposes a technique of making various conditions such as the wavelength of illumination light and an illumination condition selectable, and selecting an optimum condition in accordance with a device in a measurement optical system. Japanese Patent Laid-Open No. 2003-324054 proposes a technique of optimizing an alignment condition (alignment parameter) easily and accurately.

In recent years, however, a case in which the variation in device manufacturing process poses a problem increases due to an increase in various device manufacturing steps. In such a situation, in order to implement accurate alignment, the related art of optimizing the alignment parameter on a specific device basis or on a step basis in the same device becomes insufficient. More specifically, it becomes necessary to optimize the alignment parameter on the all step basis of all devices, on the shot basis in a substrate surface in the same step, or on an alignment mark basis in the same shot.

For an alignment parameter having the small (low-dimensional) number of combinations of the illumination conditions and the like to be optimized in the related art, it is also possible to optimize the alignment parameter automatically by confirming all conditions. However, automatically optimizing an alignment parameter having the large (high-dimensional) number of combinations of template shapes used in prealignment, window shapes used in fine alignment, and the like is not easy because of its enormous conditions.

SUMMARY OF THE INVENTION

According to one aspect of the present invention, there is provided a pattern forming apparatus that forms a pattern on a substrate, the apparatus including a detection optical system configured to obtain optical information of a mark provided on the substrate by detecting the mark, and a processing unit configured to perform a process of obtaining a position of the mark by using a template for obtaining the position of the mark by being applied to the optical information of the mark and a window which indicates a region for extracting an amount of characteristic indicating the position of the mark from a waveform signal obtained from the optical information, wherein the processing unit decides, based on the optical information of the mark obtained by the detection optical system, a parameter indicating at least one of a shape of the template and a shape of the window for each of a plurality of substrates, and obtains the position of the mark by using the decided parameter.

Further aspects of the present invention will become apparent from the following description of exemplary embodiments with reference to the attached drawings.

DESCRIPTION OF THE EMBODIMENTS

Figure 1:
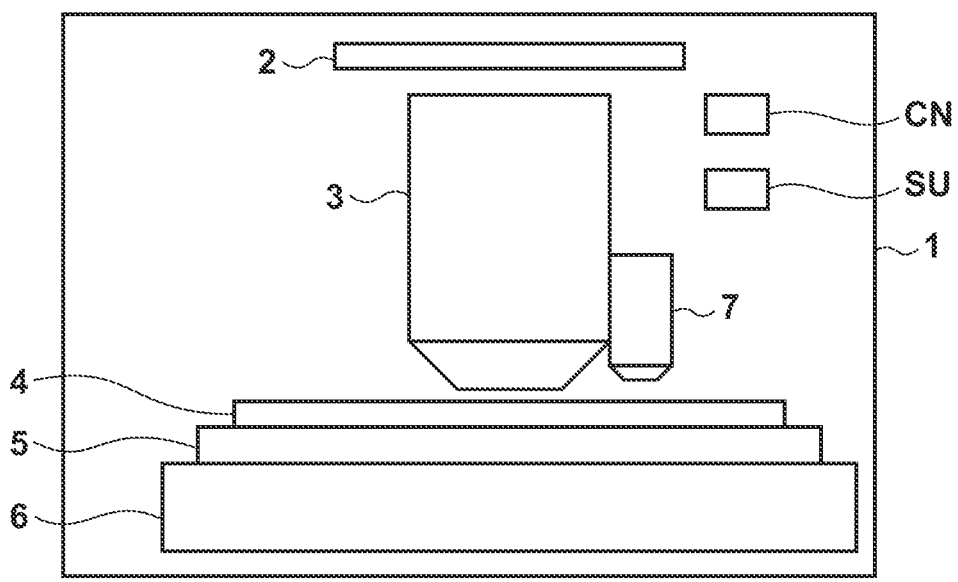
FIG. 1 is a schematic view showing the arrangement of an exposure apparatus according to an aspect of the present invention.

Preferred embodiments of the present invention will be described below with reference to the accompanying drawings. Note that the same reference numerals denote the same members throughout the drawings, and a repetitive description thereof will not be given.

FIG. 1 is a schematic view showing the arrangement of an exposure apparatus 1 according to an aspect of the present invention. The exposure apparatus 1 is a pattern forming apparatus that forms a pattern on a substrate 4 and in this embodiment, exposes the substrate 4 by projecting a pattern of a reticle 2 on the substrate 4 via a projection optical system 3. The exposure apparatus 1 includes the projection optical system 3 that projects (reduces and projects) a pattern formed on the reticle 2, and a chuck 5 that holds the substrate 4 on which an underlayer pattern and an alignment mark have been formed in a previous step. The exposure apparatus 1 also includes a substrate stage 6 that holds the chuck 5 and positions the substrate 4 at a predetermined position, a detection optical system 7 that obtains optical information of an alignment mark provided on the substrate 4 by detecting the alignment mark, a control unit CN GU, and a storage unit SU. Note that the optical information of the alignment mark includes positional information of the alignment mark obtained by detecting light from the alignment mark. The optical information of the alignment mark includes, for example, an image including the alignment mark (image thereof), an alignment signal (one-dimensional waveform signal) indicating the intensity of the light from the alignment mark, and the like which are obtained by capturing the alignment mark.

The control unit CN is formed by, for example, a computer (information processing apparatus) that includes a CPU, a memory, and the like and comprehensively controls the respective units of the exposure apparatus 1 in accordance with programs stored in the storage unit SU and the like. In this embodiment, the control unit CN functions as a processing unit that performs, based on the optical information of the alignment mark obtained by the detection optical system 7, a process (alignment process) of obtaining the position of the alignment mark, that is, the position of the substrate 4 in alignment of the substrate 4. Note that a template is used to obtain the position of the alignment mark by being applied to the optical information of the alignment mark. A window indicates a region for extracting an amount of characteristic that indicates the position of the alignment mark from a waveform signal obtained from the optical information of the alignment mark.

The storage unit SU stores, for example, a program needed to perform exposure processing for exposing the substrate 4 by controlling the respective units of the exposure apparatus 1. Note that the exposure processing also includes the above-described alignment processing. In this embodiment, the storage unit SU also stores the optical information of the alignment mark obtained by the detection optical system 7 and the template (shape thereof) or the window (shape thereof) needed for the alignment processing.

Figure 2:
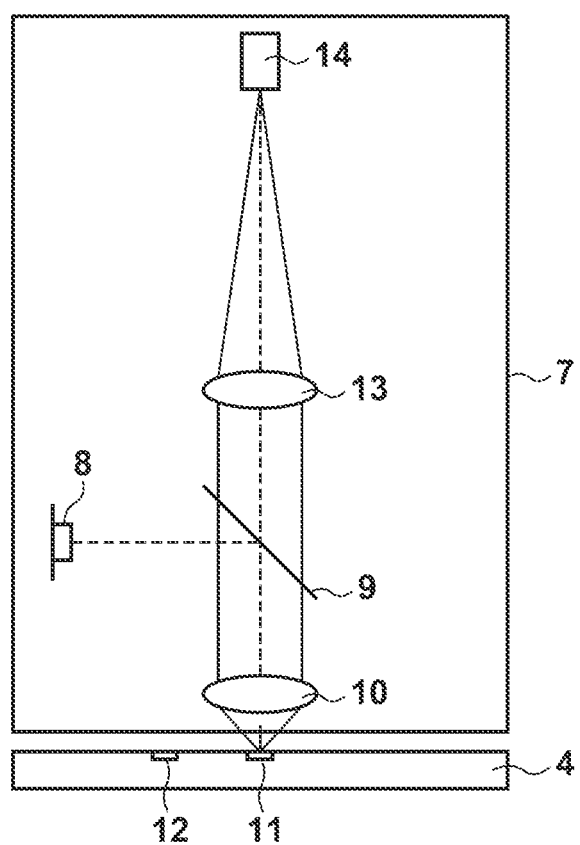
FIG. 2 is a schematic view showing the arrangement of a detection optical system of the exposure apparatus shown in FIG. 1.

FIG. 2 is a schematic view showing the arrangement of the detection optical system 7. Light from a light source 8 is reflected by a beam splitter 9 and illuminates an alignment mark 11 or 12 provided on the substrate 4 via a lens 10. Light diffracted by the alignment mark 11 or 12 is received by a sensor 14 via the lens 10, the beam splitter 9, and a lens 13. Note that the lenses 10 and 13 enlarge light from the alignment mark 11 or 12 by a predetermined magnification, and form an image of the light on the sensor 14.

Figure 3:
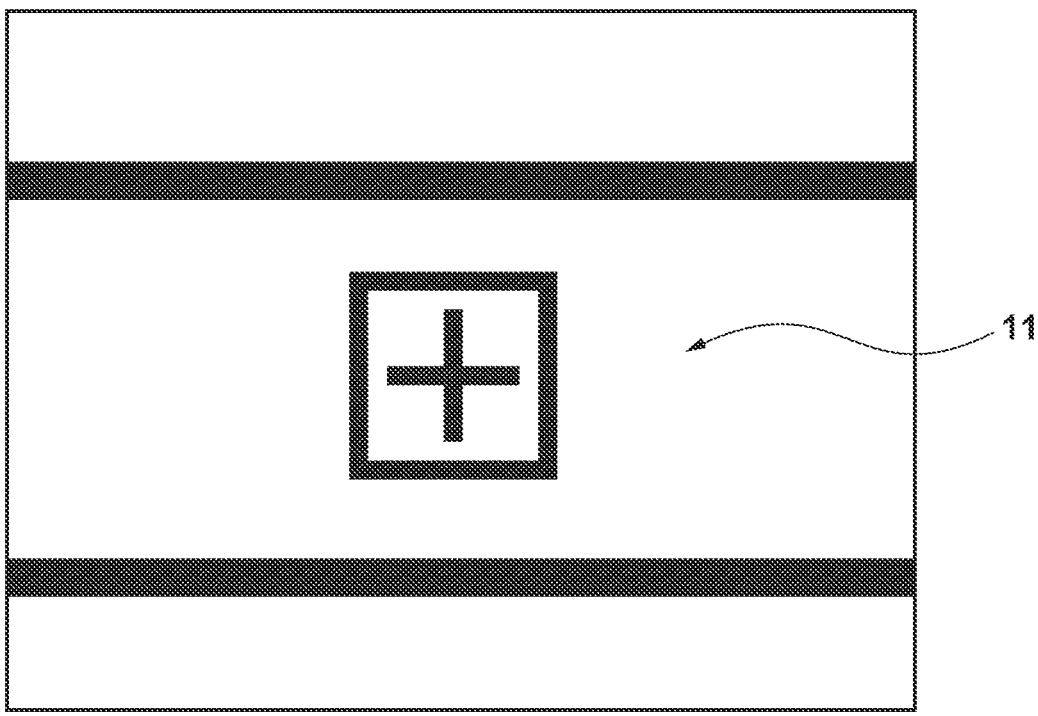
FIG. 3 is a view showing an example of the shape of an alignment mark used for prealignment.
Figure 4:
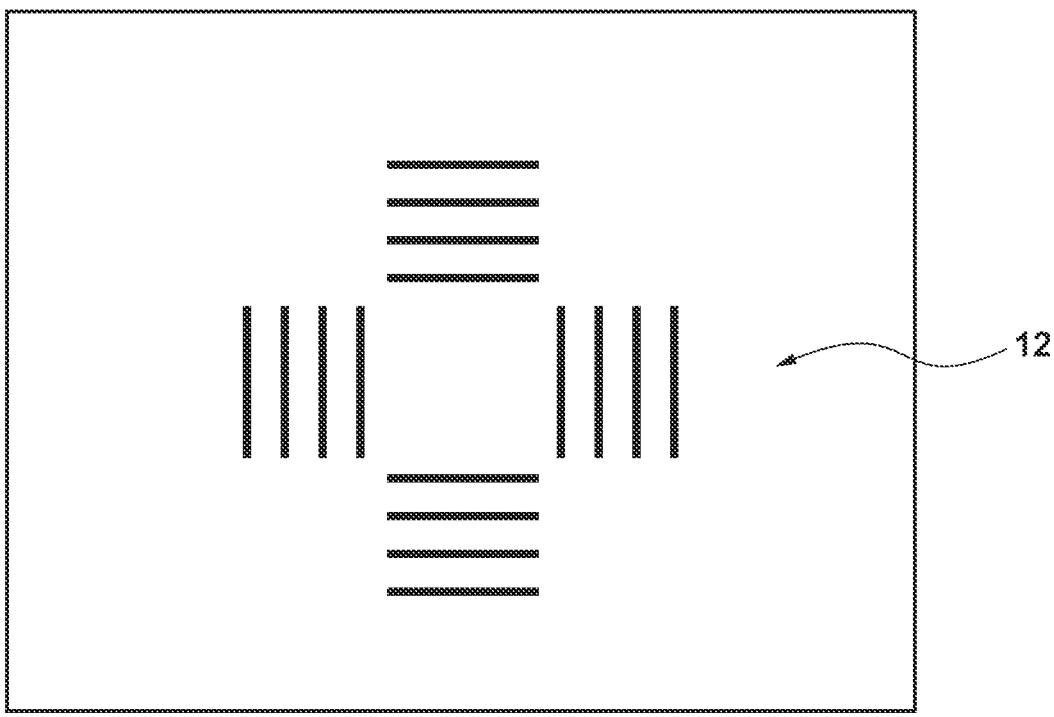
FIG. 4 is a view showing an example of the shape of an alignment mark used for fine alignment.

The exposure apparatus 1 adopts, as an alignment method, a method obtained by combining prealignment capable of detecting an alignment mark in a wide range with low accuracy and fine alignment capable of detecting an alignment mark in a narrow range with high accuracy. Therefore, each of the alignment marks 11 and 12 provided on the substrate 4 has a shape suitable for an alignment application. For example, the alignment mark 11 is used for prealignment and has a shape shown in FIG. 3 in this embodiment. The alignment mark 12 is used for fine alignment and has a shape shown in FIG. 4 in this embodiment. However, the respective shapes of the alignment marks 11 and 12 are not limited to the shapes shown in FIGS. 3 and 4. For example, the alignment marks 11 and 12 may have the same shape. In this embodiment, the alignment marks 11 and 12 are detected by the detection optical system 7. However, the alignment marks 11 and 12 may be detected separately by different detection optical systems.

Figure 5:
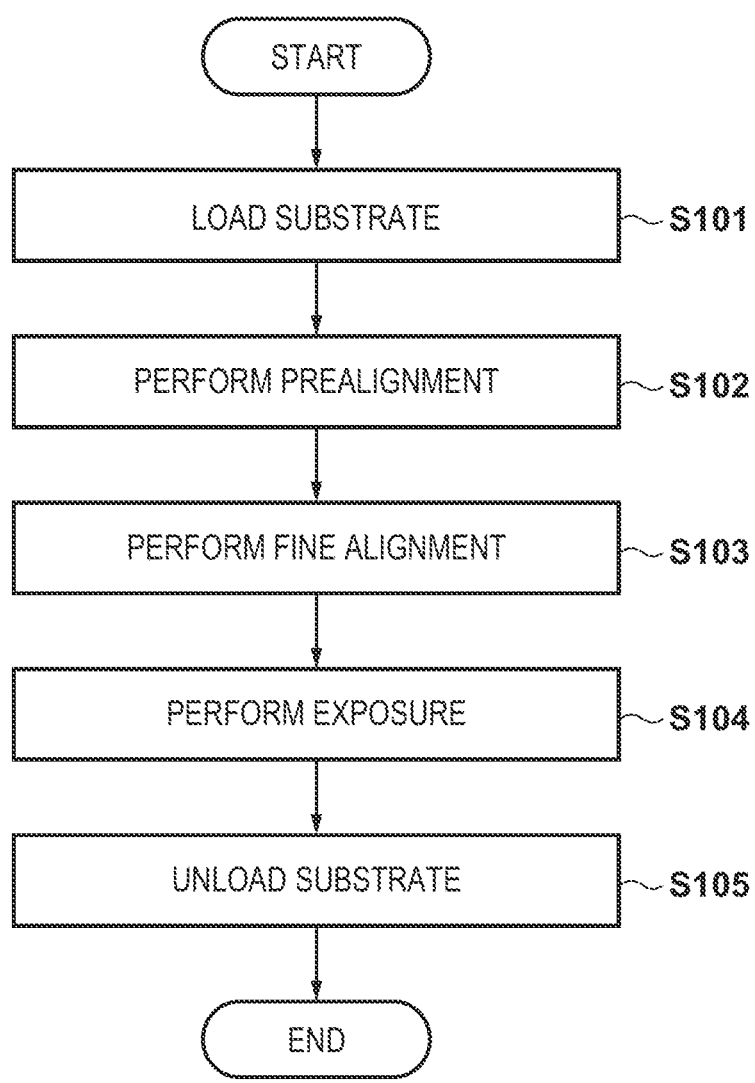
FIG. 5 is a flowchart for explaining general exposure processing.

General exposure processing in the exposure apparatus 1 will be described with reference to FIG. 5. The outline of a process until the substrate 4 is aligned and exposed will be described here. In step S101, the substrate 4 is loaded to the exposure apparatus 1. In step S102, prealignment is performed. More specifically, the alignment mark 11 provided on the substrate 4 is detected by the detection optical system 7, obtaining the position of the substrate 4 roughly. At this time, the alignment marks 11 are detected in a plurality of shot regions of the substrate 4, obtaining a whole shift in the substrate 4 and a one-dimensional linear component (a magnification or a rotation). Note that a process of obtaining the position of the alignment mark 11 will be described later.

In step S103, fine alignment is performed. More specifically, based on the result of prealignment, the substrate stage 6 is driven to a position capable of detecting the alignment mark 12 by the detection optical system 7, and the alignment mark 12 provided in each of the plurality of shot regions of the substrate 4 is detected by the detection optical system 7. Then, the whole shift in the substrate 4 and the one-dimensional linear component (the magnification or the rotation) are obtained precisely. At this time, it is also possible to obtain a higher-order deformation component of the substrate 4 precisely by obtaining the positions of the large number of shot regions. This makes it possible to obtain the precise position of each shot region of the substrate 4. Note that a process of obtaining the position of the alignment mark 12 will be described later.

In step S104, the substrate 4 is exposed. More specifically, after performing fine alignment, the pattern of the reticle 2 is transferred to each shot region of the substrate 4 via the projection optical system 3. In step S105, the substrate 4 is unloaded from the exposure apparatus 1.

First, the process of obtaining the position of the alignment mark 11 in prealignment (step S102) will be described here. When obtaining the position (the position on the sensor) of the alignment mark 11, for example, template matching is used. As a method for template matching, a case in which a normalized cross-correlation (NCC) is used as an amount of characteristic will be described below as an example. However, the amount of characteristic is not limited to NCC, and various types shown below can be used as the amount of characteristic.

SSD (Sum of Squared Difference)
SAD (Sum of Absolute Difference)
ZNCC (Zero-mean Normalized Cross-Correlation)

An equation of the NCC is given by:

$$R_{NCC} = \frac{\sum_{j=0}^{N-1}\sum_{i=0}^{M-1} I(i,j)T(i,j)}{\sqrt{\sum_{j=0}^{N-1}\sum_{i=0}^{M-1} I(i,j)^2 \times \sum_{j=0}^{N-1}\sum_{i=0}^{M-1} T(i,j)^2}} \quad (1)$$

where $T(i, j)$ is a value of brightness of the template, $I(i, j)$ is a value of brightness of a mark, M is the number of pixels of the template in a horizontal direction, N is the number of pixels of the template in a vertical direction, and $R_{NCC}$ is a degree of correlation.

With respect to an image including the alignment mark 11 (image thereof), the template is scanned in the image, searching for the position of the maximum degree of correlation in the image. Then, the position of the maximum degree of correlation is set to the position of the alignment mark 11. Note that the image including the alignment mark 11 is obtained by the detection optical system 7 as the optical information of the alignment mark 11.

Figure 6:
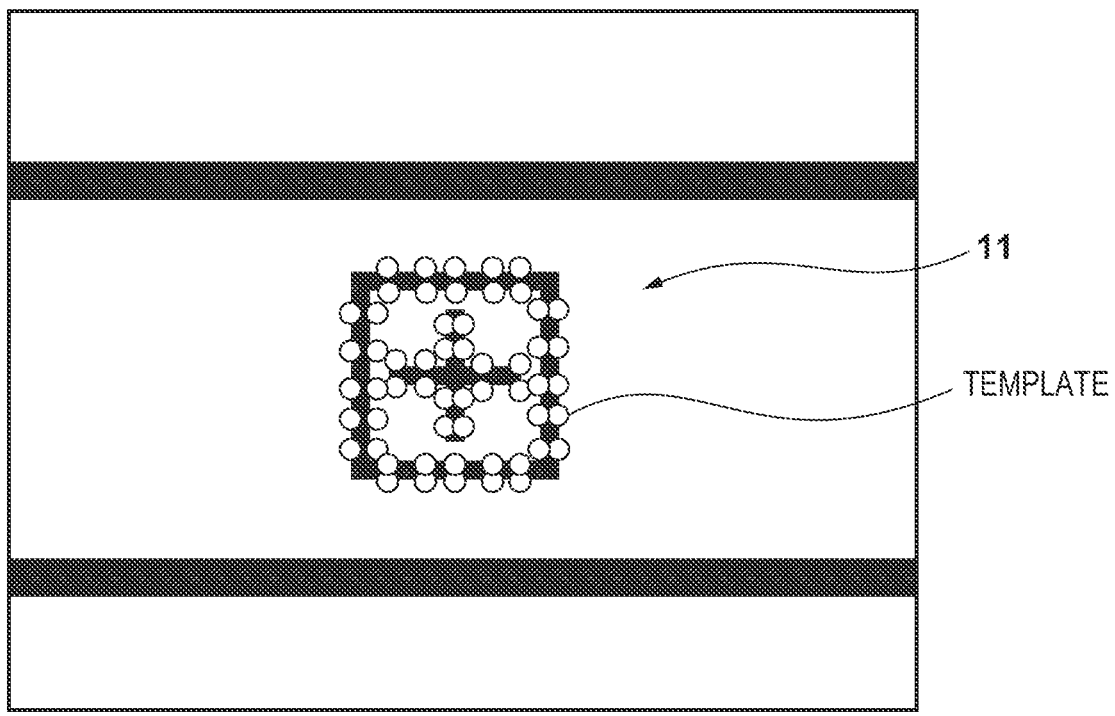
FIG. 6 is a view showing an example of a template used in prealignment.
Figure 7:
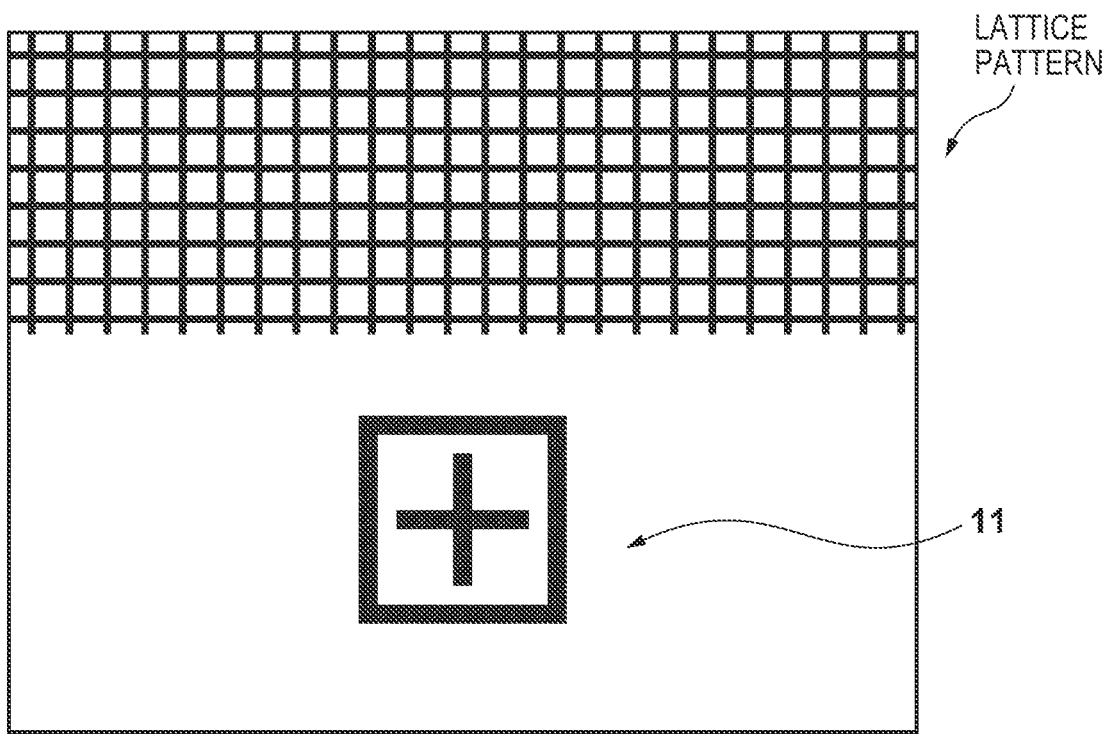
FIG. 7 is a view showing an example of an image that includes an alignment mark used in prealignment.

Since a short processing time is also required in prealignment, a template for the alignment mark 11 uses several tens of discrete values indicated by a frame of circles in FIG. 6. Elements needed for prealignment accuracy is, regardless of a process, a high degree of correlation at a true position of the alignment mark and a low degree of correlation at a position other than the alignment mark. For example, with respect to the image including the alignment mark 11 as shown in FIG. 7, consider a case in which the template shown in FIG. 6 is scanned in the image. In this case, the template has only the discrete limited values, and thus the degree of correlation between the template and a lattice pattern present above the alignment mark 11 tends to become high. Because of this, the position of the alignment mark 11 may be obtained erroneously, for example, when the state of a process changes.

Figure 8:
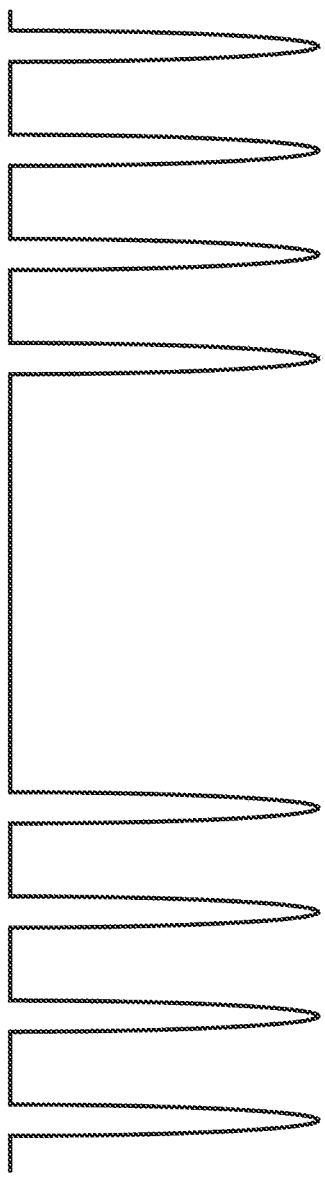
FIG. 8 is a view showing an example of a one-dimensional waveform signal generated in fine alignment.

The process of obtaining the position of the alignment mark 12 in fine alignment (step S103) will be described next. In fine alignment, images of the alignment mark 12 which are included in an image obtained by the detection optical system 7 are integrated in a non-measurement direction to generate a one-dimensional waveform signal, and signal processing is performed on the one-dimensional waveform signal, obtaining the position of the alignment mark 12. FIG. 8 is a view showing an example of the one-dimensional waveform signal which is generated by integrating the images of the alignment mark 12 included in the image in the non-measurement direction.

Concerning a means for integrating the images (optical images) of the alignment mark 12, there is, for example, a method of integrating the optical images by a lens and receiving light by a one-dimensional line sensor or a method of integrating the optical images on a computer from an image obtained by a two-dimensional area sensor. As the means for integrating the images of the alignment mark 12, there is also PDA (Phase Detection Alignment). PDA is a method of obtaining an interference signal with a reference lattice and generating the one-dimensional waveform signal by irradiating a lattice-shaped alignment mark with laser light and scanning the substrate stage 6 while receiving the diffracted light by the detection optical system.

When obtaining the position of the alignment mark 12 from the one-dimensional waveform signal, as in prealignment, an NCC using a template, an NCC with a self-inversion image if the alignment mark 12 has symmetry, or the like is used. However, the present invention is not limited to these, and the position of the alignment mark 12 may be obtained from the one-dimensional waveform signal by using various amounts of characteristics such as a PC (Phase Correlation) using a correlation with phase information.

In the signal processing for the one-dimensional waveform signal, an important element needed to implement high accuracy is a specific portion of the one-dimensional waveform signal to receive attention to obtain an amount of characteristic, that is, a setting of a processing region (to be referred to as a "window shape" hereinafter) for the one-dimensional waveform signal. The window shape is generally set with reference to a design value of the alignment mark. However, if the size of the alignment mark varies from the design value due to the influence of a device manufacturing process or the like, a noise signal including an error component enters the window, lowering the alignment accuracy.

Therefore, as in the related art, only optimizing a low-dimensional alignment parameter such as the wavelength of light illuminating the alignment mark, an illumination condition, or the like is insufficient. Therefore, in this embodiment, there is provided a new technique of optimizing a high-dimensional alignment parameter such as the shape of a template used in prealignment, the shape of a window used in fine alignment, or the like.

First Embodiment

In the first embodiment, a template shape (a parameter indicating the shape of a template) used in prealignment is optimized by using reinforcement learning. Reinforcement learning is a learning method of acquiring an optimum action in an unknown environment through trial and error based on reward data. The details of reinforcement learning theory are published in many literatures such as "Sutton, Richard S.; Barto, Andrew G. (1988). Reinforcement Learning: An Introduction". Only the outline related to this embodiment will be described here.

In reinforcement learning, values of various forms can be used for rewards to be goals at the time of learning. In one example, however, a learning example by an "action evaluation function $Q^\pi(s, a)$" is shown. The action evaluation function $Q^\pi(s, a)$ is given by:

$$Q^\pi(s,a) = E_\pi\{\Sigma_k \gamma^k r_{t+1+k} | s_t=s, a_t=a\} \quad (2)$$

where t represents time, s represents a state, a represents an action, π represents a policy, $E_\pi\{\cdot\}$ represents an expectation value under the policy π, r represents a reward, γ represents a discount rate of a future reward, and k represents time until the future reward.

An acting subject (agent) acts so as to maximize the action evaluation function $Q^\pi(s, a)$ in equation (2). At this time, the action is performed while selecting, in accordance with the predetermined policy π, an "optimum action based on a past experience" and a "search for a new action" aiming at acquiring a further reward. At this time, since an equation of the expectation value considers the future reward, it is possible to cope with a situation in which though a reward decreases in a short term, a large reward is obtained in a long term. This makes it possible to learn a state and an action of maximizing the action evaluation function $Q^\pi(s, a)$.

Figure 9:
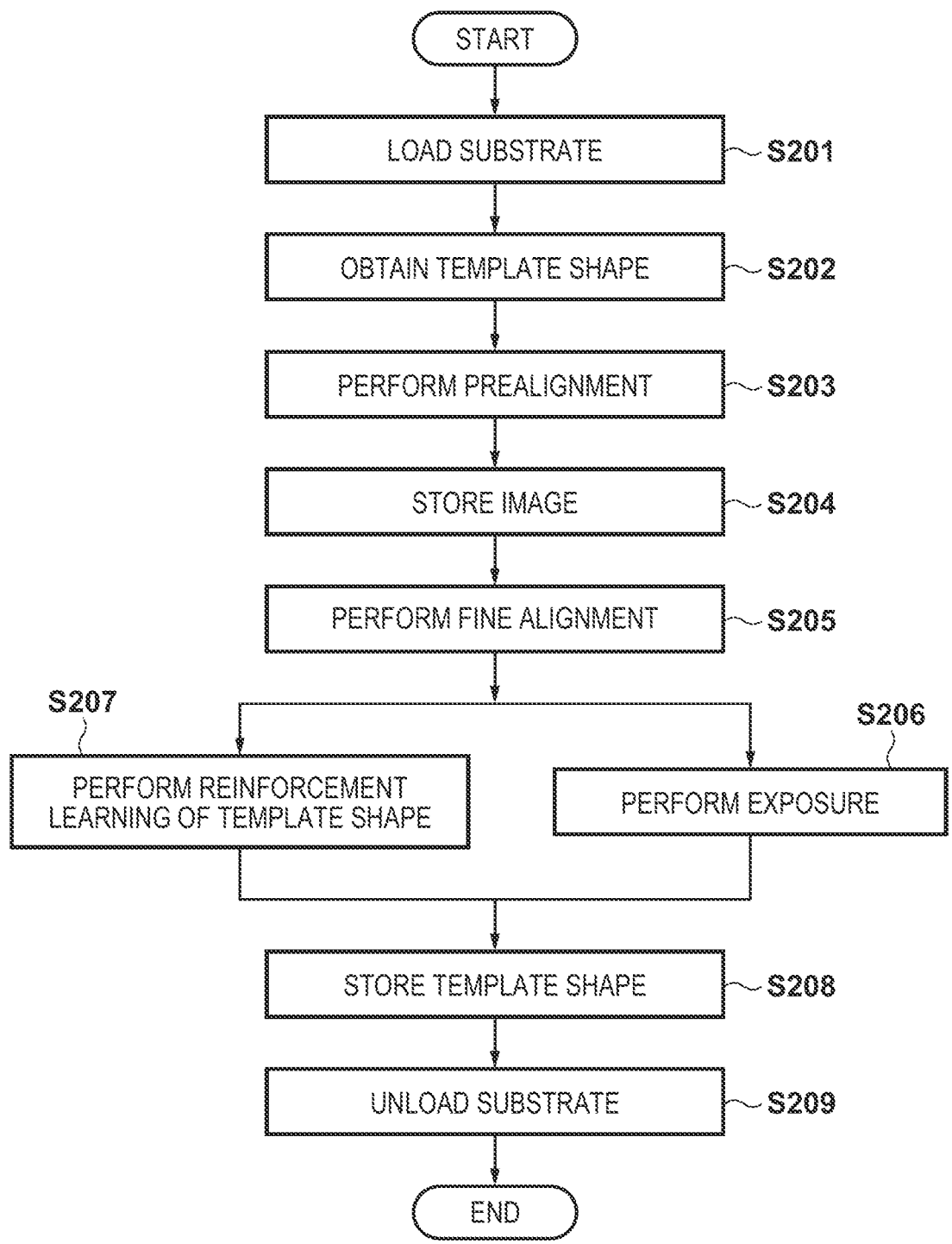
FIG. 9 is a flowchart for explaining exposure processing according to the first embodiment.

The first embodiment will be described in detail below. FIG. 9 is a flowchart for explaining exposure processing according to the first embodiment. The outline of a process until a substrate 4 is aligned and exposed will be described here. As described above, the exposure processing is performed by causing the control unit CN to comprehensively control the respective units of the exposure apparatus 1.

In step S201, the substrate 4 is loaded to an exposure apparatus 1. In step S202, a template shape is obtained from a storage unit SU. In step S203, prealignment is performed. In step S204, an image (mark image) obtained by detecting an alignment mark 11 by a detection optical system 7 is stored in the storage unit SU in prealignment. In step S205, fine alignment is performed. In step S206, the substrate 4 is exposed. In parallel with exposure of the substrate 4, reinforcement learning of the template shape is performed in step S207. Note that reinforcement learning of the template shape will be described later. In step S208, the template shape (the template shape after reinforcement learning) obtained in step S207 is stored (saved) in the storage unit SU. In step S209, the substrate 4 is unloaded from the exposure apparatus 1.

Concerning reinforcement learning of the template shape (step S207), a state setting, a reward setting, an action setting, a policy setting, and a processing sequence will be described in detail in that order.

A template shape used in prealignment is defined as $T_i(x_i, y_i)$, and let s be a state. Note that i represents a template number ($1 \leq i \leq N$), N represents the number of templates, and $x_i$ and $y_i$ represent coordinates (x, y) of the ith template. In this embodiment, the state s changes in accordance with the policy π to be described later.

An optimum state of the template shape to be reached by reinforcement learning is set to a template shape that satisfies the following condition (1) and condition (2).

Condition (1): The sum total of degrees of correlation at true positions of alignment marks 11 in mark images on a plurality of substrates is maximized.

Condition (2): The sum total of the maximum degrees of correlation at positions other than the true positions of the alignment marks 11 in the mark images on the plurality of substrates is minimized.

The reward r in equation (2) representing the action evaluation function $Q^\pi(s, a)$ is defined by:

$$r = \sum_{w=1}^{WN}(R_{NCC1st(w)} - \log(R_{NCC2nd(w)})) \quad (3)$$

where w represents a substrate number, WN represents the total number of substrates, $R_{NCC1st(w)}$ represents a degree of correlation at the true position of the alignment mark 11 in the mark image on the wth substrate, and $R_{NCC2nd(w)}$ represents a maximum degree of correlation at a position other than the true position of the alignment mark 11 in the mark image on the wth substrate.

Equation (3) expects that the reward r increases when the degree of correlation at the true position of the alignment mark 11 is high, and the degree of correlation at the position other than the true position of the alignment mark 11 is low. In other words, the reward r is obtained by using the sum total of degrees of correlation between a template and mark regions on substrates where the alignment marks 11 exist, and the sum total of degrees of correlation between the template and peripheral regions of the mark regions. However, the present invention is not limited to equation (3), and any equation may be used as long as the same effect as equation (3) is obtained. Considering that a contribution is not made any more to the reward r if a value is equal to or smaller than a specific threshold, $R_{NCC2nd(w)}$ may pass through an activating function to be enabled only if the value is larger than the threshold. Note that the total number of substrates WN may be 25 as the general total number for one lot, or may be larger or smaller than 25.

The action $\underline{a}$ is defined by:

$$a_i = \{a_{i1}, a_{i2}, a_{i3}, a_{i4}\}$$

$$a_{i1}: T_i(x_i, y_i) \rightarrow T_i((x+1)_i, y_i)$$

$$a_{i2}: T_i(x_i, y_i) \rightarrow T_i((x-1)_i, y_i)$$

$$a_{i3}: T_i(x_i, y_i) \rightarrow T_i(x_i, (y+1)_i)$$

$$a_{i4}: T_i(x_i, y_i) \rightarrow T_i(x_i, (y-1)_i)$$

where i represents the template number ($1 \leq i \leq N$), and N represents the number of templates. The action $\underline{a}$ is an action of moving the position of a template by one step for each of vertical and horizontal directions in order to search for a new template shape. The present invention is not limited to the action $\underline{a}$ as long as an action can search for the new template shape, and another action may be defined.

The policy π is defined as follows.

Policy π: An action $a_i$ is selected randomly, and the template shape is updated if the action evaluation function $Q^\pi(s, a)$ is increased.

Note that without considering the future reward, time k until the future reward is set to 0, the discount rate γ of the future reward is set to 0.01, and the action evaluation function $Q^\pi(s, a)$ is set to be equivalent to the reward r.

Figure 10B:
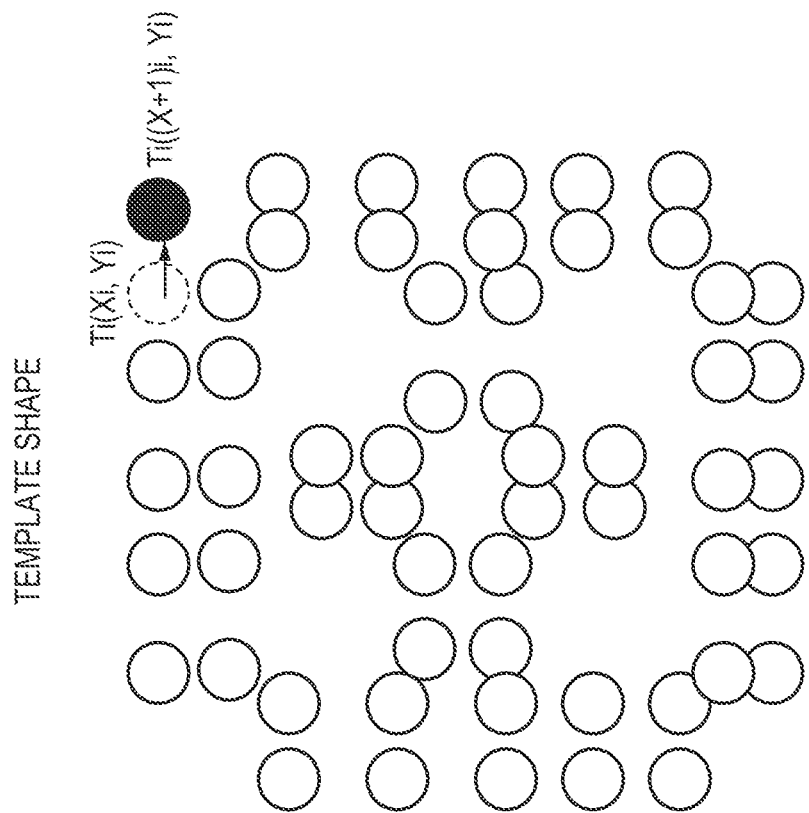
FIGS. 10A and 10B are views each for explaining an example of a measure in reinforcement learning in detail.
Figure 10A:
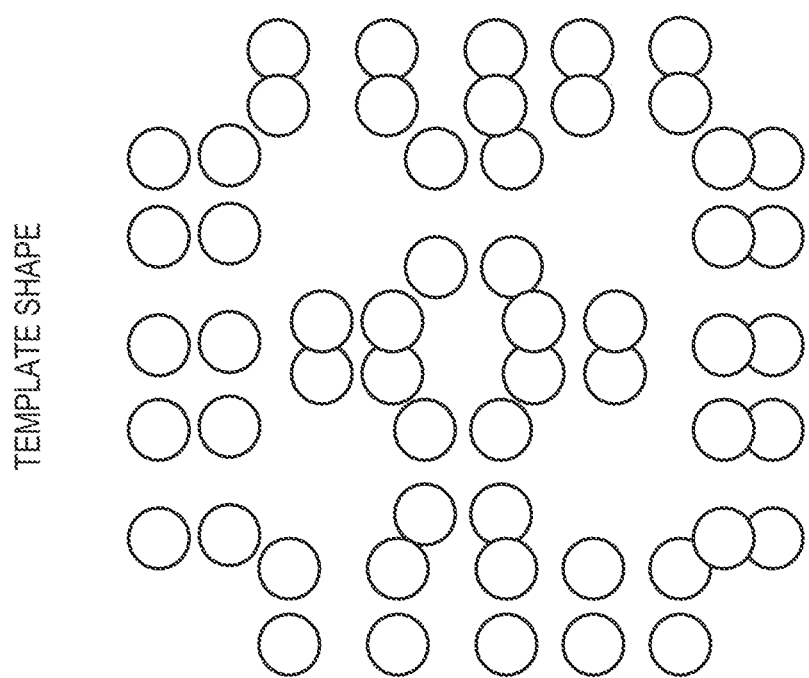

The policy π will be described in detail with reference to FIGS. 10A and 10B. First, a template shape in an initial state $s_0$ at t=0 is a shape shown in FIG. 10A. Then, the template shape changes to a shape shown in FIG. 10B by an action $a_{i1}(T_i(x_i, y_i) \rightarrow T_1((x+1)_i, y_i))$ selected randomly. If the action evaluation function $Q^\pi(s, a)$ at this time is increased relative to the action evaluation function $Q^\pi(s, a)$ in the initial state $s_0$, a template shape in a state $s_1$ at t=1 is updated to the shape shown in FIG. 10B. On the other hand, if the action evaluation function $Q^\pi(s, a)$ at this time is not increased relative to the action evaluation function $Q^\pi(s, a)$ in the initial state $s_0$, the template shape in the state $s_1$ at t=1 remains the shape shown in FIG. 10A. Thus, if the action evaluation function $Q^\pi(s, a)$ is better than the previous action evaluation function $Q^\pi(s, a)$, the template shape is updated. This makes it possible to perform optimization to a template shape in which the action evaluation function $Q^\pi(s, a)$ is increased as the time t progresses under the policy π. Note that the time t is equivalent to a learning count (epoch), and thus progress of the time t by one step will be referred to as "leaning once" hereinafter.

Note that the definition of the policy π may select the action $\underline{a}$ in accordance with any probability distribution. An arbitrary condition such as unselecting an action of shifting to a searched state may be added. Setting a value equal to or larger than 1 for the time k until the future reward, the action evaluation function $Q^\pi(s, a)$ may be maximized based on an accumulated reward. In this case, though the learning count until optimization increases, it becomes possible to optimize a template shape without falling into a local solution even if an optimum template shape exists at a small distance.

Figure 11:
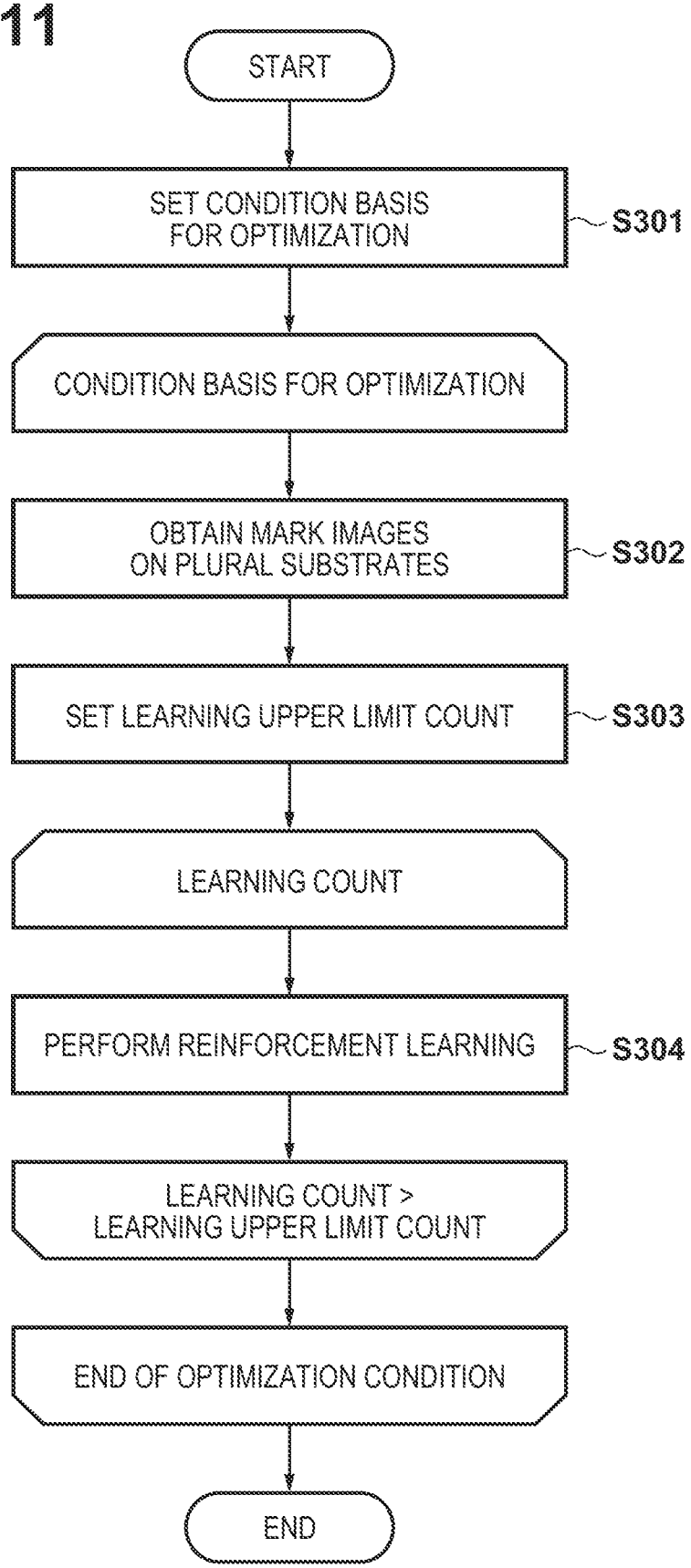
FIG. 11 is a flowchart for explaining a processing sequence in reinforcement learning of a template shape.

A processing sequence in reinforcement learning of a template shape will be described with reference to FIG. 11. In step S301, a condition basis for optimization is set. For example, if a template shape is optimized for each shot region of the substrate 4, the number of shot regions is set as the condition basis for optimization. In step S302, a mark image obtained by the detection optical system 7 for each of the plurality of substrates 4 is obtained (read out) from the storage unit SU. In step S303, the upper limit of the execution count of reinforcement learning (learning upper limit count) is set. The learning upper limit count to be set here is the maximum count executable in parallel with exposure of the substrate 4 in a situation in which learning does not progress sufficiently. On the other hand, 0 may be set for the learning upper limit count in a situation in which reinforcement learning progresses sufficiently, and a desired reward is obtained. Even in a situation in which the desired reward is not obtained, 0 may be for the learning upper limit count by determining that the upper limit of optimization is reached if an amount of an increase in reward at the time of the previous reinforcement learning is equal to or smaller than a predetermined threshold. In step S304, above-described reinforcement learning is performed in accordance with the condition basis for optimization set in step S301 and the learning upper limit count set in step S303.

Figure 12:
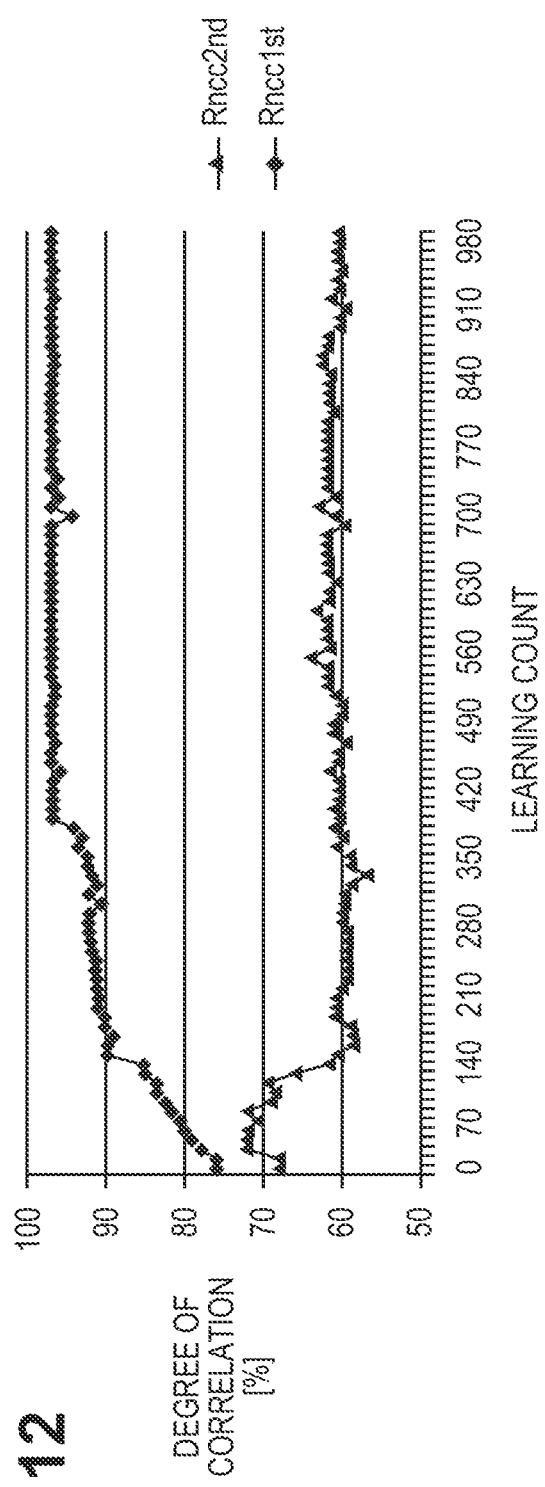
FIG. 12 is a graph showing the result of optimization of a learning count, and a degree of characteristic $R_{NCC1st}$ and a maximum degree of characteristic $R_{NCC2nd}$ according to the first embodiment.

FIG. 12 is a graph showing the result of optimization of the learning count (epoch), and a degree of characteristic $R_{NCC1st}$ and a maximum degree of characteristic $R_{NCC2nd}$ in a case in which reinforcement learning is performed by adding an activating function having a 60% threshold to $R_{NCC2nd}$ in equation (3). In FIG. 12, the ordinate represents a degree of correlation, and the abscissa represents the learning count. Referring to FIG. 12, it is found that the degree of characteristic $R_{NCC1st}$ at a true position of an alignment mark increases, and the maximum degree of characteristic $R_{NCC2nd}$ at a position other than the true position of the alignment mark decreases to the threshold (60%) by repeating reinforcement learning. In other words, it is possible to optimize the template shape as desired by repeating reinforcement learning.

Figure 13:
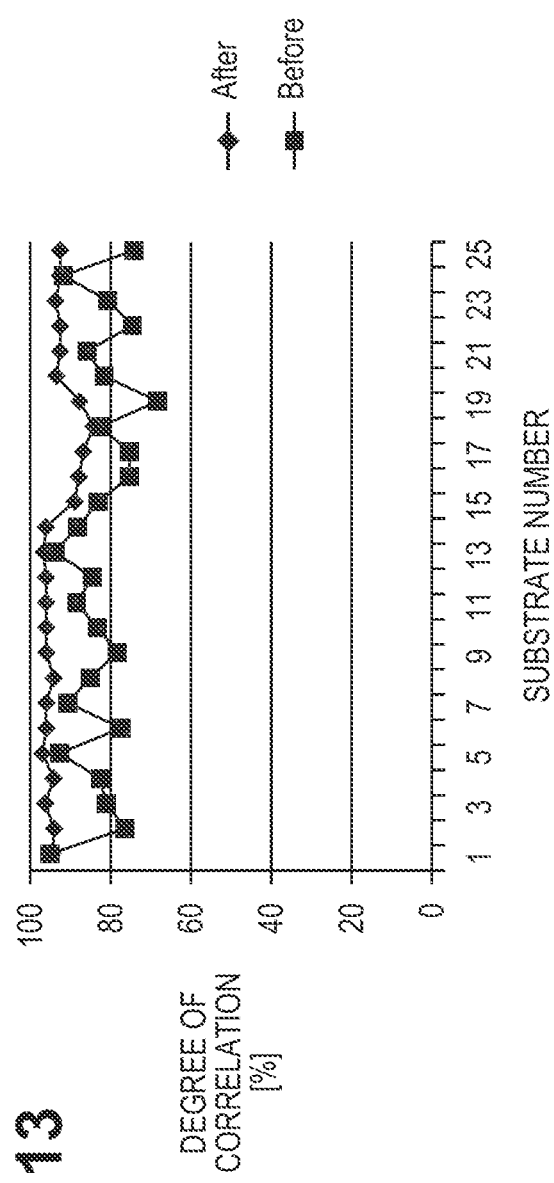
FIG. 13 is a graph for explaining that the template shape can be optimized to a robust state.

Note that the degree of characteristic $R_{NCC1st}$ at the true position of the alignment mark is the sum total of the mark images on the plurality of substrates 4, and thus optimization can also be made to the most robust state for a variation in device manufacturing process. For example, as shown in FIG. 13, a variation in degree of correlation among the substrates also becomes small before and after optimization. In FIG. 13, the ordinate represents a degree of correlation, and the abscissa represents a substrate number. Note that after optimization (After) corresponds to a case in which this embodiment is applied, and before optimization (Before) corresponds to a case in which this embodiment is not applied, that is, the related art.

According to this embodiment, it becomes possible to automatically optimize (decide) the template shape used for prealignment. It also becomes possible to optimize the template shape in an arbitrary condition basis for optimization. Note that a timing at which reinforcement learning is performed is not limited to a timing in parallel with exposure of the substrate 4. For example, in prealignment (at the time of detection of an alignment mark), reinforcement learning may be performed until the desired reward is obtained, or the timing at which reinforcement learning is performed may be an arbitrary timing.

When storing the mark images on the plurality of substrates 4 in the storage unit SU, a mark image on the substrate 4 to be stored may be decided freely. For example, the storage unit SU may update a past mark image so as to store the latest mark images on the plurality of substrates 4. If the degree of similarity between a new mark image and a stored mark image is equal to or smaller than a threshold, the new mark image may be stored, and a memory amount (data amount) for mark images may be increased as much as possible.

Second Embodiment

In the second embodiment, a window shape (a parameter indicating the shape of a window) used in fine alignment is optimized by using reinforcement learning.

Figure 14:
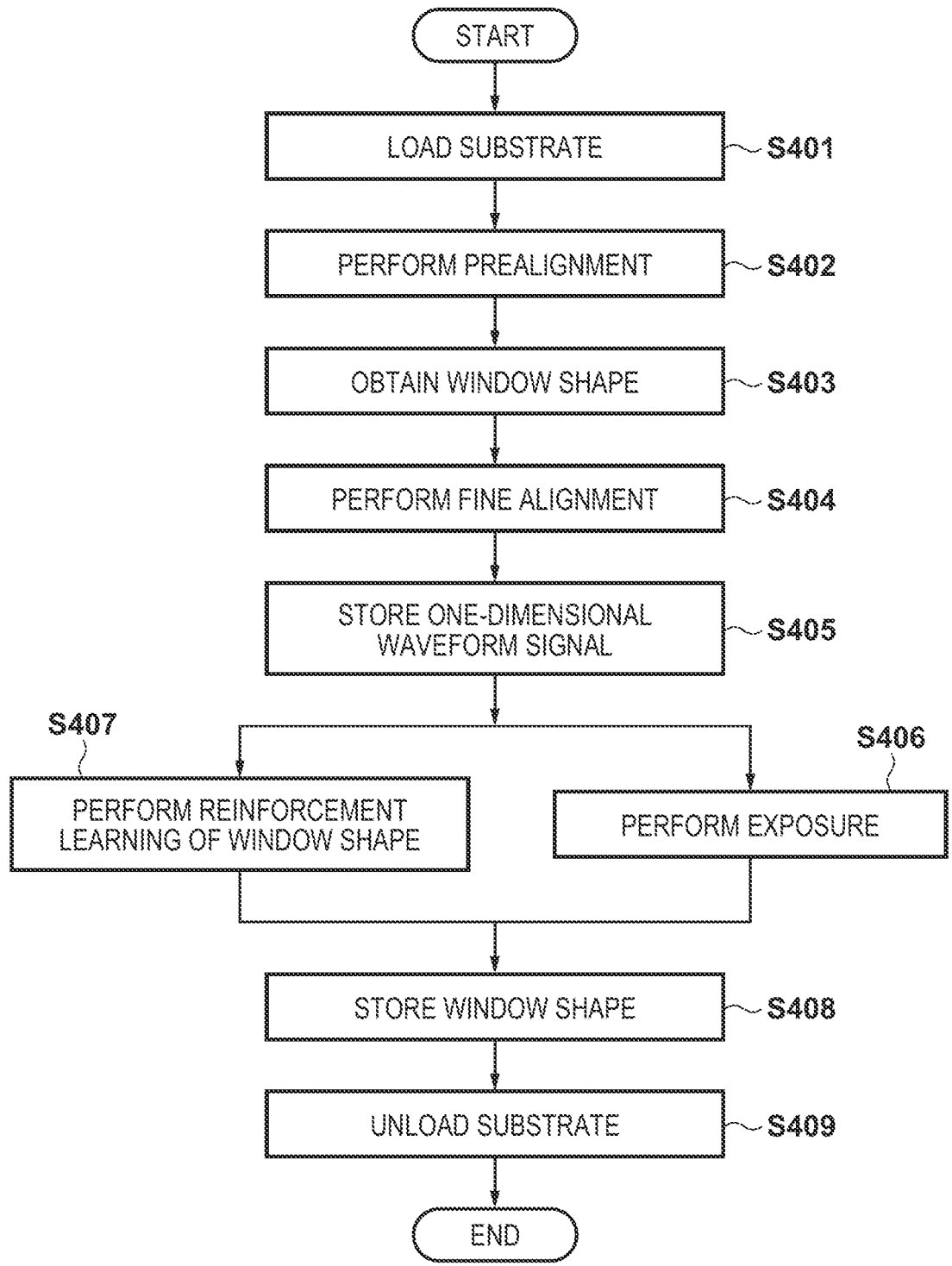
FIG. 14 is a flowchart for explaining exposure processing according to the second embodiment.

FIG. 14 is a flowchart for explaining exposure processing according to the second embodiment. The outline of a process until a substrate 4 is aligned and exposed will be described here. As described above, the exposure processing is performed by causing the control unit CN to comprehensively control the respective units of the exposure apparatus 1.

In step S401, the substrate 4 is loaded to an exposure apparatus 1. In step S402, prealignment is performed. In step S403, the window shape is obtained from a storage unit SU. In step S404, fine alignment is performed. In step S405, a one-dimensional waveform signal which is obtained from an image (mark image) obtained by detecting an alignment mark 12 by a detection optical system 7 is stored in the storage unit SU in fine alignment. In step S406, the substrate 4 is exposed. In parallel with exposure of the substrate 4, reinforcement learning of the window shape is performed in step S407. Note that reinforcement learning of the window shape will be described later. In step S408, the window shape (the window shape after reinforcement learning) obtained in step S407 is stored (saved) in the storage unit SU. In step S409, the substrate 4 is unloaded from the exposure apparatus 1.

Concerning reinforcement learning of the window shape (step S407), a state setting, a reward setting, an action setting, a policy setting, and a processing sequence will be described in detail in that order.

A window shape used in fine alignment is defined as Wi, and let s be a state. Note that Wi represents the weight ($0 \le Wi \le 1$) multiplied (applied) to the ith value when extracting an amount of characteristic, and i represents a window number ($1 \le i \le N$), and N represents the number of windows. In this embodiment, the state s changes in accordance with a policy π to be described later.

An optimum state of the window shape to be reached by reinforcement learning is to be set to a window shape that satisfies the following condition (A).

Condition (A): Measurement errors at true positions of the alignment marks 12 of one-dimensional waveform signals on a plurality of substrates 4 are minimized.

However, in order to obtain the measurement errors at the true positions of the alignment marks 12, it is necessary to actually expose the substrates 4 and measure an overlay result thereof by an external measuring apparatus, resulting in taking time. To cope with this, in this embodiment, the optimum state of the window shape to be reached by reinforcement learning is set to a window shape that satisfies the following condition (B).

Condition (B): A variation in the mark distance M between the alignment marks 12 of the one-dimensional waveform signals on the plurality of substrates is minimized.

Figure 15:
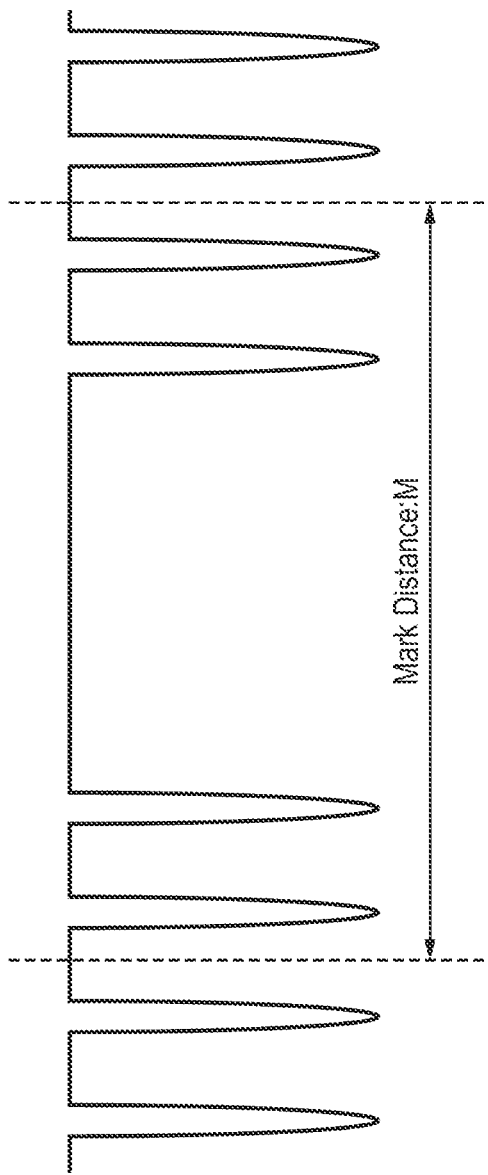
FIG. 15 is a view showing a detailed example of a mark distance between alignment marks.

FIG. 15 is a view showing the mark distance M between the alignment marks 12 in detail. The mark distance M is ideally an invariant to be the same value on all the substrates 4. In practice, however, the measurement errors when measuring the alignment marks 12 become dominant, causing the variation in the mark distance M (a variation in size of the alignment marks 12 or a variation in positional shift of the alignment marks 12) among the plurality of substrates 4. It is therefore possible to regard the mark distance M as an approximate value of a measurement error to be minimized truly, making it possible to use it for learning in a targeted optimum state. Thus, a reward r in equation (2) representing an action evaluation function $Q^\pi(s, a)$ is defined by:

$$r = \sigma(M) \quad (4)$$

where $\sigma(M)$ represents a standard deviation of M on a plurality of substrates WN, and WN represents the total number of substrates. Note that the total number of substrates WN may be 25 as the general total number for one lot, or may be larger or smaller than 25.

An action $\underline{a}$ is defined by:

$$a_i = \{a_{i1}, a_{i2}\}$$

$$a_{i1} : W_i \to \tfrac{1}{2} \times W_i$$

$$a_{i2} : W_i \to 2 \times W_i$$

where i represents the window number ($1 \le i \le N$), N represents the number of windows. The action $\underline{a}$ is an action of increasing/decreasing the weight of each window in order to search for a new window shape. The present invention is not limited to the action $\underline{a}$ as long as an action can search for the new window shape, and another action may be defined.

The policy $\pi$ is defined as follows.

Policy $\pi$: An action $a_i$ is selected randomly, and the window shape is updated if the action evaluation function $Q^\pi(s, a)$ is increased.

Note that without considering a future reward, time k until the future reward is set to 0, a discount rate $\gamma$ of the future reward is set to 0.01, and the action evaluation function $Q^\pi(s, a)$ is set to be equivalent to the reward r.

Figure 16A:
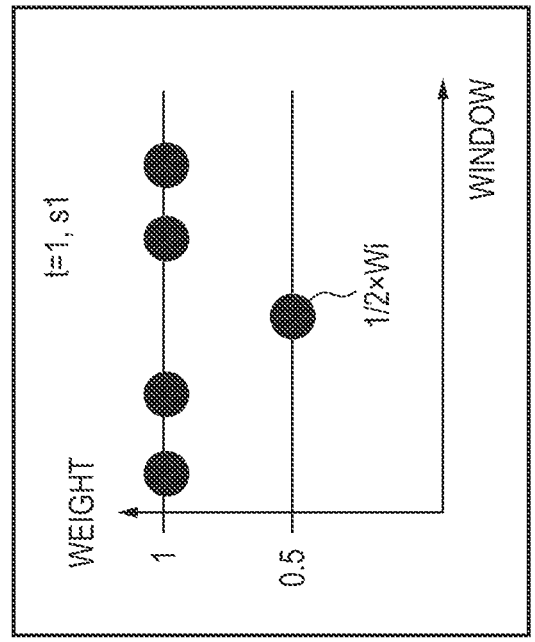
FIGS. 16A and 16B are views each for explaining an example of a measure in reinforcement learning in detail.
Figure 16B:
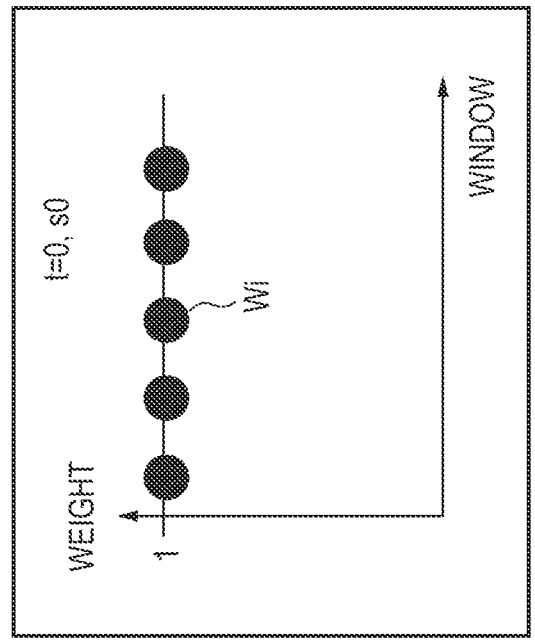

The policy $\pi$ will be described in detail with reference to FIGS. 16A and 16B. First, a window shape in an initial state $s_0$ at t=0 is a shape shown in FIG. 16A. Then, the window shape changes to a shape shown in FIG. 16B by an action $a_{i1}(W_i \to \tfrac{1}{2} \times W_i)$ selected randomly. If the action evaluation function $Q^\pi(s, a)$ at this time is increased relative to the action evaluation function $Q^\pi(s, a)$ in the initial state $s_0$, a window shape in a state $s_1$ at t=1 is updated to the shape shown in FIG. 16B. On the other hand, if the action evaluation function $Q^\pi(s, a)$ at this time is not increased relative to the action evaluation function $Q^\pi(s, a)$ in the initial state $s_0$, the window shape in the state $s_1$ at t=1 remains the shape shown in FIG. 16A. This makes it possible to perform optimization to a window shape in which the action evaluation function $Q^\pi(s, a)$ is increased as time t progresses under the policy $\pi$.

Note that the definition of the policy $\pi$ may select the action $\underline{a}$ in accordance with any probability distribution. An arbitrary condition such as unselecting an action of shifting to a searched state may be added. Setting a value equal to or larger than 1 for the time k until the future reward, the action evaluation function $Q^\pi(s, a)$ may be maximized based on an accumulated reward. In this case, though the learning count until optimization increases, it becomes possible to optimize a window shape without falling into a local solution even if the weight of a window has a nonlinear characteristic.

Figure 17:
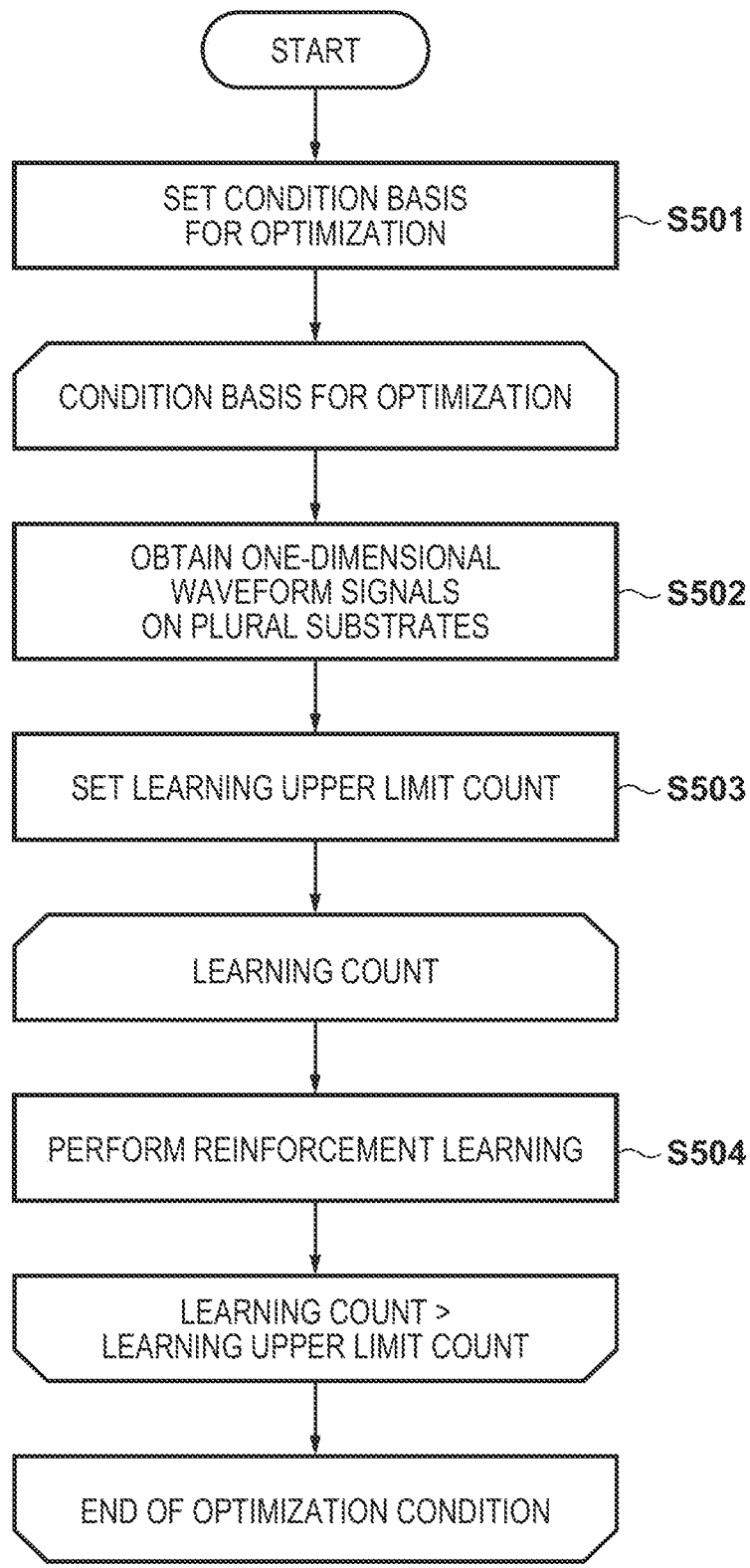
FIG. 17 is a flowchart for explaining a processing sequence in reinforcement learning of a window shape.

A processing sequence in reinforcement learning of a window shape will be described with reference to FIG. 17. In step S501, a condition basis for optimization is set. For example, if a window shape is optimized for each alignment mark 12 in a shot region of the substrate 4, the number of shot regions×the number of alignment marks 12 is set as the condition basis for optimization. In step S502, a one-dimensional waveform signal which is obtained from a mark image obtained by the detection optical system 7 for each of the plurality of substrates 4 is obtained (read out) from the storage unit SU. In step S503, the upper limit of the execution count of reinforcement learning (learning upper limit count) is set. The learning upper limit count to be set here is the maximum count executable in parallel with exposure of the substrate 4 in a situation in which learning does not progress sufficiently. On the other hand, 0 may be set for the learning upper limit count in a situation in which reinforcement learning progresses sufficiently, and a desired reward is obtained. Even in a situation in which the desired reward is not obtained, 0 may be for the learning upper limit count by determining that the upper limit of optimization is reached if an amount of an increase in reward at the time of the previous reinforcement learning is equal to or smaller than a predetermined threshold. In step S504, above-described reinforcement learning is performed in accordance with the condition basis for optimization set in step S501 and the learning upper limit count set in step S503.

Figure 18:
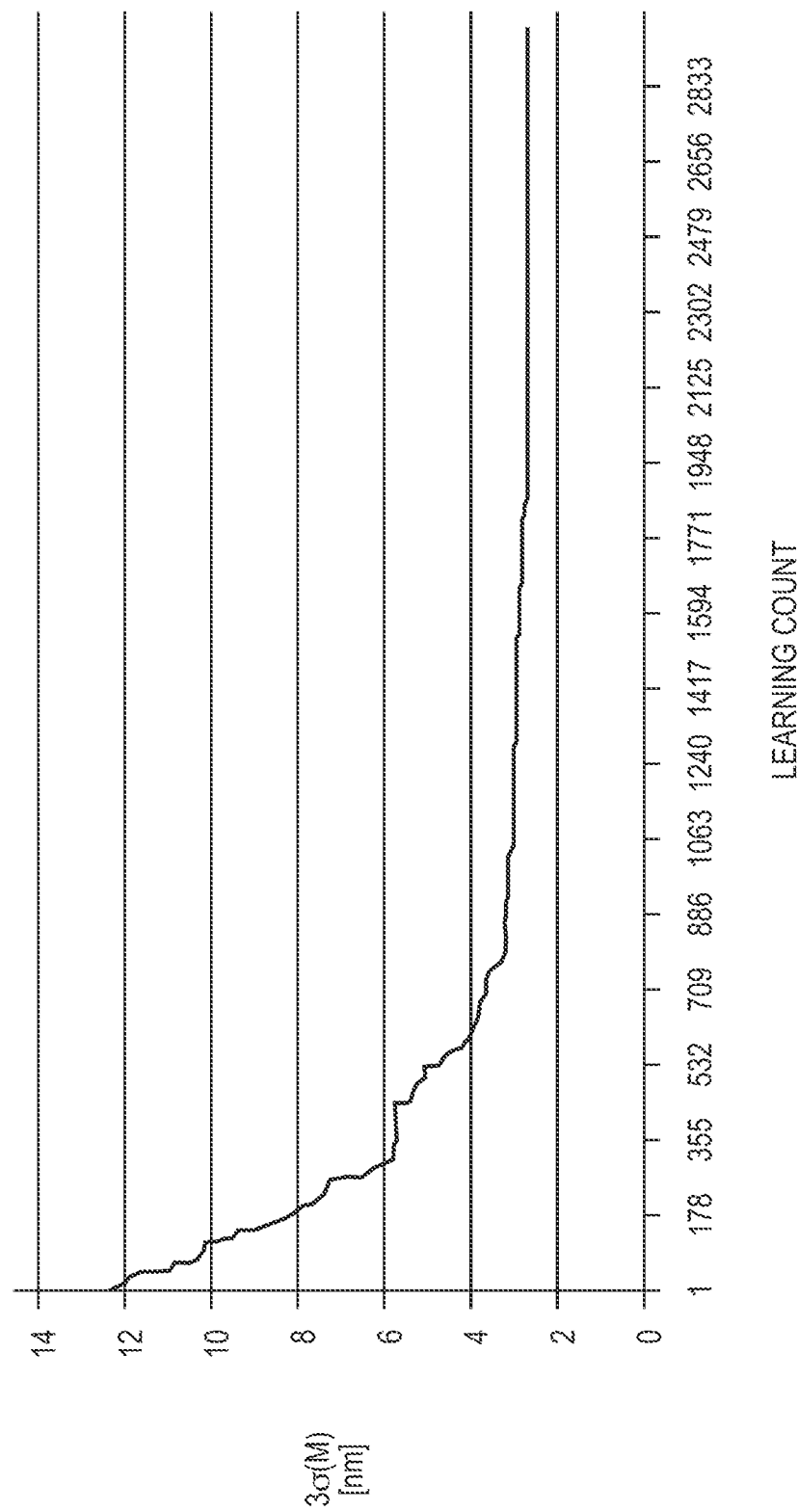
FIG. 18 is a graph showing a relationship between a learning count and $3\sigma(M)$ when reinforcement learning is performed.

FIG. 18 is a graph showing a relationship between the learning count (epoch) and $3\sigma(M)$ (3 Standard Deviation of M) in a case in which reinforcement learning is performed. In FIG. 18, the ordinate represents $3\sigma(M)$, and the abscissa represents the learning count. Referring to FIG. 18, it is found that $3\sigma(M)$ indicating a measurement error decreases by repeating reinforcement learning. Note that an initial value (learning count=0) before reinforcement learning corresponds to a case in which this embodiment is not applied, that is, the related art.

According to this embodiment, it becomes possible to automatically optimize (decide) the window shape used for fine alignment. It also becomes possible to optimize the window shape in an arbitrary condition basis for optimization. Note that a timing at which reinforcement learning is performed is not limited to a timing in parallel with exposure of the substrate 4. For example, in fine alignment (at the time of detection of an alignment mark), reinforcement learning may be performed until the desired reward is obtained, or the timing at which reinforcement learning is performed may be an arbitrary timing. Reinforcement learning of the window shape may be performed simultaneously with reinforcement learning of a template shape used for prealignment.

Third Embodiment

In the third embodiment, in fine alignment using an optimized window shape, a measurement value offset between the optimized window shape and an initial window shape is corrected.

Figure 19:
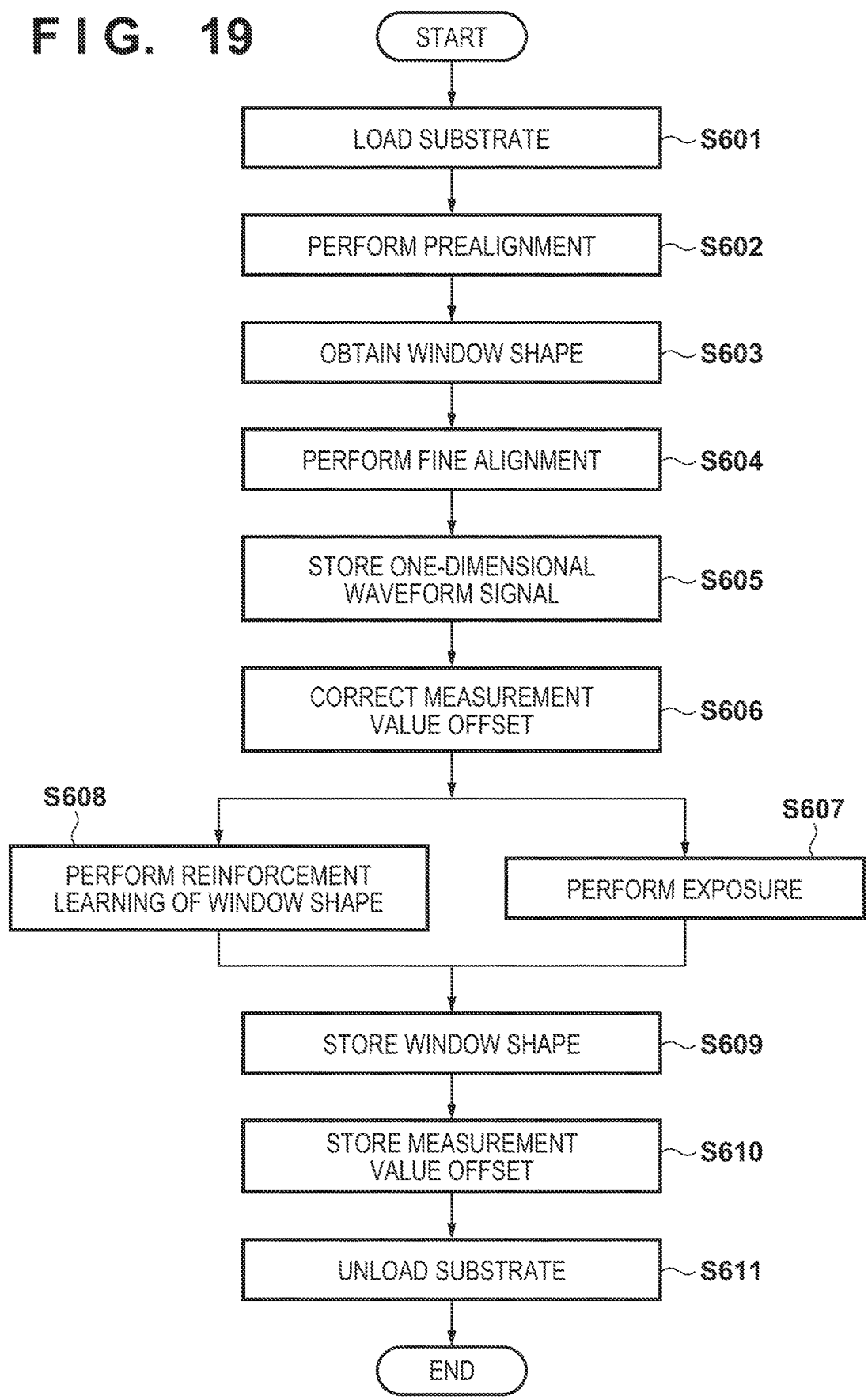
FIG. 19 is a flowchart for explaining exposure processing according to the third embodiment.

FIG. 19 is a flowchart for explaining exposure processing according to the third embodiment. The outline of a process until a substrate 4 is aligned and exposed will be described here. As described above, the exposure processing is performed by causing the control unit CN to comprehensively control the respective units of the exposure apparatus 1. Note that processes from step S601 to step S605 are the same as processes from step S401 to step S405 described in the second embodiment, and thus the detailed description here will be omitted.

In step S606, a difference between the position (measurement value) of an alignment mark 12 obtained by using the initial (before learning) window shape and the position of the alignment mark 12 obtained by using a current (after learning) window shape is obtained from a storage unit SU, correcting the measurement value offset. Note that an effect of correcting the measurement value offset will be described later. In step S607, the substrate 4 is exposed. In parallel with exposure of the substrate 4, reinforcement learning of the window shape is performed in step S608. In step S609, the window shape (the window shape after reinforcement learning) obtained in step S608 is stored (saved) in the storage unit SU. In step S610, the measurement value offset is stored in the storage unit SU. Here, a difference between a measurement value obtained by using the initial window shape and a measurement value obtained by using the current window shape is obtained for each of the one-dimensional waveform signals on the plurality of substrates 4 obtained in step S502, and an average value thereof is stored in the storage unit SU as the measurement value offset. In step S611, the substrate 4 is unloaded from the exposure apparatus 1.

The effect of correcting the measurement value offset (step S606) will be described. In alignment of an exposure apparatus 1, a common error component among the substrates is obtained as an alignment offset at the time of the initial input in each device step. The alignment offset is obtained with reference to the measurement value obtained by using the initial window shape. Accordingly, if the window shape is changed by reinforcement learning, a common alignment offset among the substrates may be changed.

In this embodiment, it becomes possible, by correcting a common change amount among the substrates, to continue the operation of each device step without changing the alignment offset. A target to be corrected here is a common offset among the substrates, and the correction does not influence the effect of optimization of the window shape. Note that in this embodiment, fine alignment has been described as an example. However, the measurement value offset may be corrected in the same manner in prealignment as well.

Fourth Embodiment

In the fourth embodiment, reinforcement learning of a template shape is performed in an external apparatus EA including a storage unit.

Figure 20:
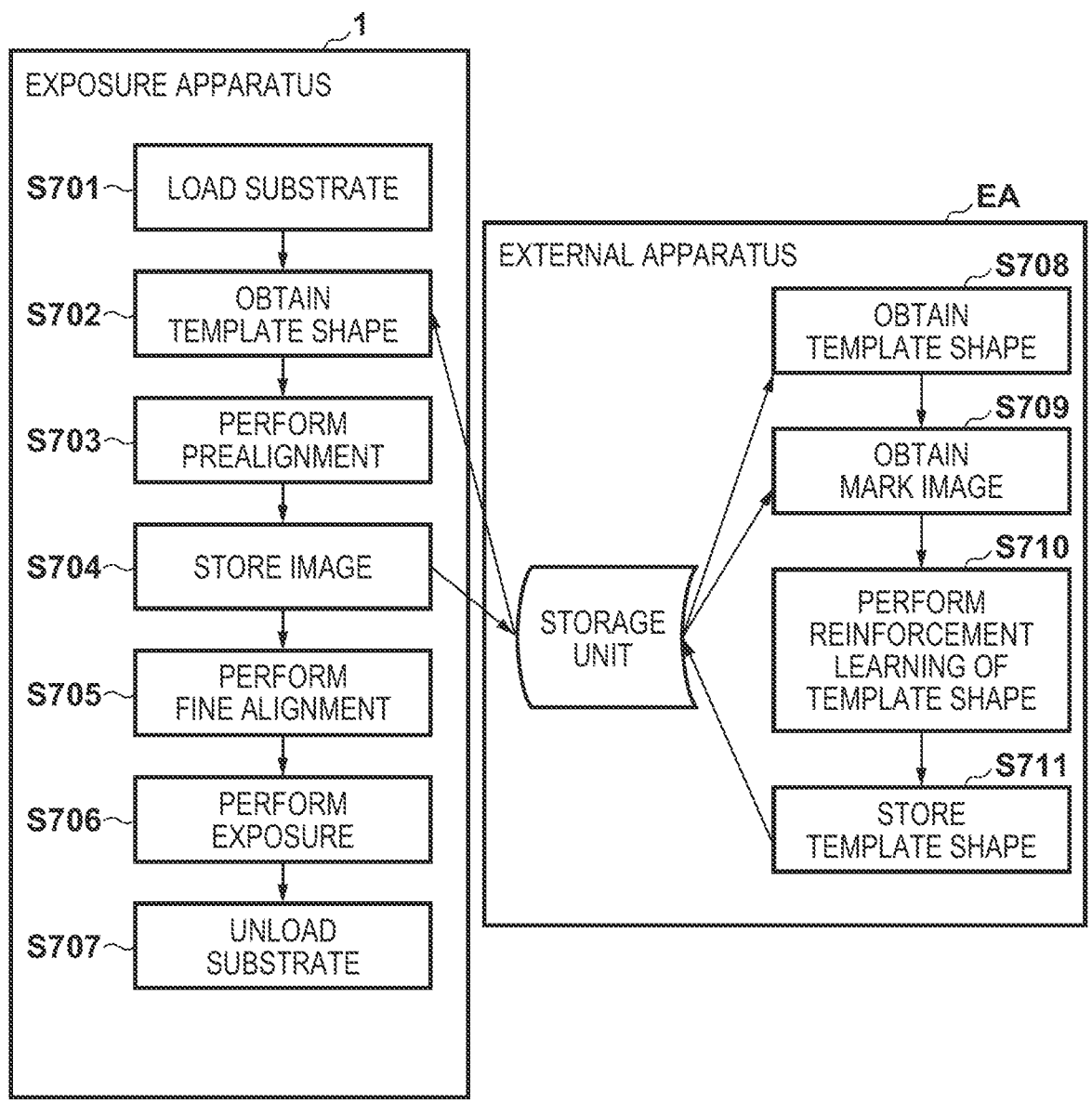
FIG. 20 is a block diagram for explaining the fourth embodiment.

FIG. 20 is a block diagram showing a process performed in each of an exposure apparatus 1 and the external apparatus EA. The outline of a process until a substrate 4 is aligned and exposed will be described here.

First, the process performed in the exposure apparatus 1 will be described. In step S701, the substrate 4 is loaded to an exposure apparatus 1. In step S702, a template shape is obtained from the storage unit of the external apparatus EA. In step S703, prealignment is performed. In step S704, an image (mark image) obtained by detecting an alignment mark 11 by a detection optical system 7 is stored in the storage unit of the external apparatus EA in prealignment. In step S705, fine alignment is performed. In step S706, the substrate 4 is exposed. In step S707, the substrate 4 is unloaded from the exposure apparatus 1.

Next, the process performed in the external apparatus EA will be described. In step S708, the template shape is obtained from the storage unit. In step S709, the mark image is obtained from the storage unit. In step S710, reinforcement learning of the template shape is performed. Note that reinforcement learning of the template shape is as described in the first embodiment. In step S710, however, it is possible to set a learning upper limit count freely without any constraint that the learning is performed in parallel with exposure of the substrate 4. In step S711, the template shape (the template shape after reinforcement learning) obtained in step S710 is stored (saved) in the storage unit.

According to this embodiment, it becomes possible to perform reinforcement learning at a timing other than a timing at which the substrate 4 is exposed and improve a learning speed. Note that in this embodiment, reinforcement learning of the template shape has been described as an example. However, the present invention is also applicable to reinforcement learning of a window shape. Reinforcement learning of the template shape and reinforcement learning of the window shape may be performed simultaneously.

Fifth Embodiment

In the fifth embodiment, reinforcement learning of a window shape is performed by using an overlay inspection result in an overlay inspection apparatus IA in an external apparatus EA including a storage unit. The overlay inspection result in the overlay inspection apparatus IA is stored in the storage unit of the external apparatus EA.

Figure 21:
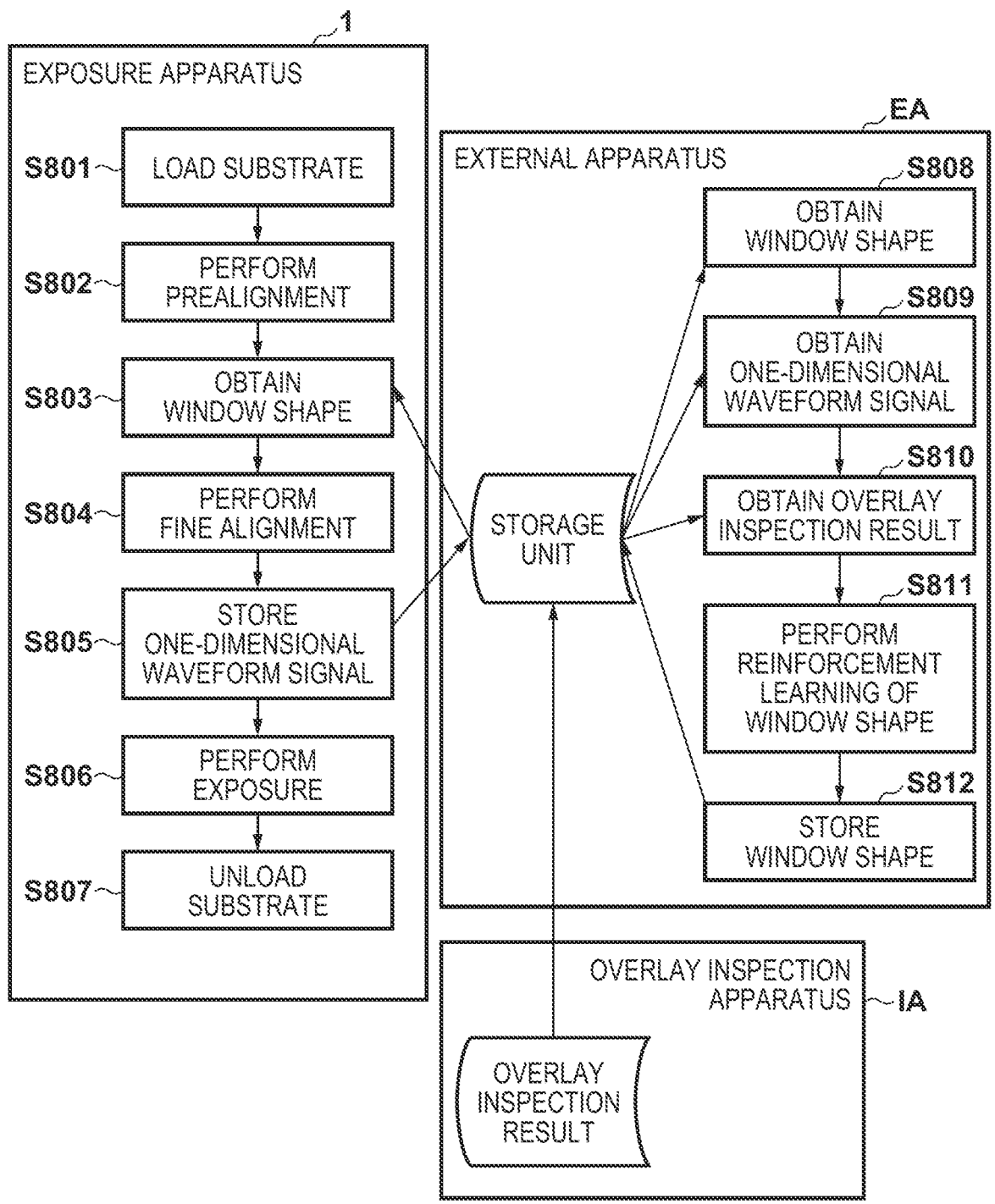
FIG. 21 is a block diagram for explaining the fifth embodiment.

FIG. 21 is a block diagram showing a process performed in each of an exposure apparatus 1 and the external apparatus EA. The outline of a process until a substrate 4 is aligned and exposed will be described here.

First, the process performed in the exposure apparatus 1 will be described. In step S801, the substrate 4 is loaded to an exposure apparatus 1. In step S802, prealignment is performed. In step S803, a window shape is obtained from the storage unit of the external apparatus EA. In step S804, fine alignment is performed. In step S805, a one-dimensional waveform signal which is obtained from an image (mark image) obtained by detecting an alignment mark 12 by a detection optical system 7 is stored in the storage unit of the external apparatus EA in fine alignment. In step S806, the substrate 4 is exposed. In step S807, the substrate 4 is unloaded from the exposure apparatus 1.

Next, the process performed in the external apparatus EA will be described. In step S808, the window shape is obtained from the storage unit. In step S809, the one-dimensional waveform signal is obtained from the storage unit. In step S810, the overlay inspection result in the overlay inspection apparatus IA is obtained from the storage unit. Note that it is necessary here to obtain an overlay inspection result corresponding to the one-dimensional waveform signal obtained in step S809. In step S811, reinforcement learning of the window shape is performed. Note that reinforcement learning of the window shape is as described in the second embodiment, but the definition of a reward r is different. The definition of the reward r will be described later. It is also possible to set a learning upper limit count freely without any constraint that the learning is performed in parallel with exposure of the substrate 4. In step S812, the window shape (the window shape after reinforcement learning) obtained in step S811 is stored (saved) in the storage unit.

The definition of the reward r in reinforcement learning of the window shape (step S811) will be described. In this embodiment, the reward r is defined by:

$$r = \sigma(OVL) \qquad (5)$$

where $\sigma(OVL)$ represents a standard deviation of OVL on a plurality of substrates WN, OVL represents the overlay inspection result, and WN represents the total number of substrates. Note that the total number of substrates WN may be 25 as the general total number for one lot, or may be larger or smaller than 25.

According to this embodiment, the storage unit of the external apparatus EA is configured to be able to obtain the overlay inspection result in the overlay inspection apparatus IA. This makes it possible to define an overlay inspection result to be minimized truly as a direct reward and perform reinforcement learning of the window shape more accurately.

Sixth Embodiment

In the sixth embodiment, reinforcement learning of a template shape is performed to be optimum for a plurality of exposure apparatuses 1 and 1' in an external apparatus EA including a storage unit.

Figure 22:
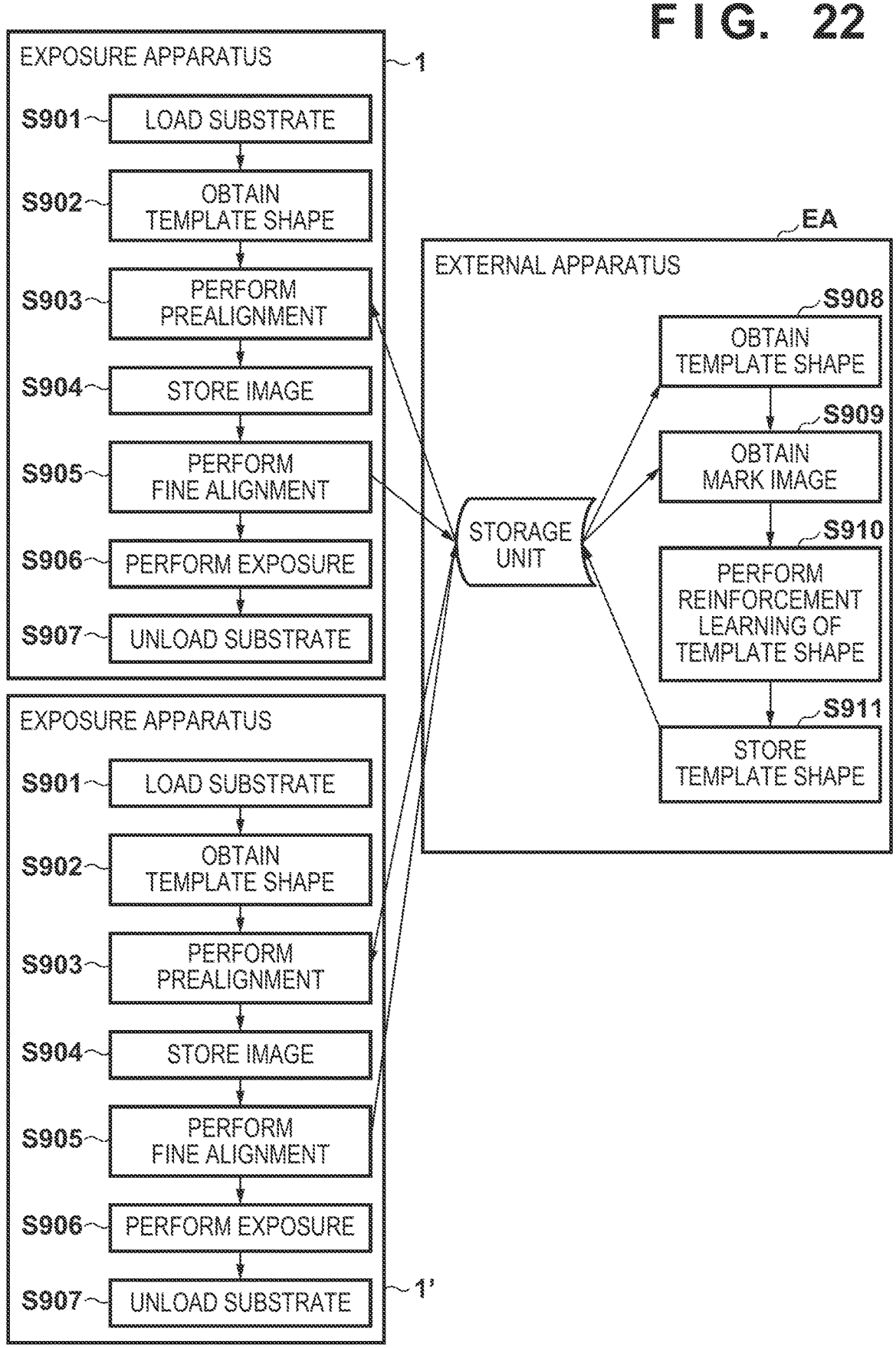
FIG. 22 is a block diagram for explaining the sixth embodiment.

FIG. 22 is a block diagram showing a process performed in each of the exposure apparatus 1, the exposure apparatus 1', and the external apparatus EA. In this embodiment, the two exposure apparatuses 1 and 1' are connected to the external apparatus EA. However, the number of exposure apparatuses connected to the external apparatus EA is not limited. Note that processes from step S901 to step S911 are the same as processes from step S701 to step S711 described in the fourth embodiment.

In this embodiment, by performing reinforcement learning by using mark images obtained by the plurality of exposure apparatuses, it is possible to perform (accelerate) reinforcement learning on a condition with less learning frequency such as of an exposure apparatus having a low operating rate or a device step processed in small number. Note that in this embodiment, reinforcement learning of the template shape has been described as an example. However, the present invention is also applicable to reinforcement learning of a window shape. Reinforcement learning of the template shape and reinforcement learning of the window shape may be performed simultaneously.

As has been described in each embodiment, the exposure apparatus 1 decides at least one of the shape of a template and the shape of a window (parameters indicating them) based on the mark image obtained by the detection optical system 7 for each of the plurality of substrates 4. More specifically, based on the mark image obtained by the detection optical system 7 for each of the plurality of substrates 4, the position of an alignment mark is obtained while changing the template shape or the window shape (parameter). Then, an action evaluation function $Q^\pi$ serving as an evaluation index for evaluating the template shape or the window shape from the position of the alignment mark is obtained, and the template shape or the window shape is decided such that the action evaluation function $Q^\pi$ meets a criterion. At this time, the template shape or the window shape may be decided so as to maximize or minimize the evaluation index.

A method of manufacturing an article according to an embodiment of the present invention is suitable for manufacturing an article such as a device (for example, a semiconductor device, magnetic storage medium, or liquid crystal display device). This manufacturing method includes a step of forming a pattern on a substrate by using the exposure apparatus 1, a step of processing the substrate on which the pattern has been formed, and a step of manufacturing an article from the processed substrate. This manufacturing method can further include other well-known steps (for example, oxidation, film formation, deposition, doping, planarization, etching, resist removal, dicing, bonding, and packaging). When compared to the conventional methods, the method of manufacturing an article according to this embodiment is advantageous in at least one of the performance, quality, productivity, and production cost of an article.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

The present invention does not limit a pattern forming apparatus to an exposure apparatus and can apply the pattern forming apparatus to an imprint apparatus as well. Note that the imprint apparatus brings a mold and an imprint material supplied onto a substrate into contact with each other, and applies curing energy to the imprint material, forming a pattern of a cured product to which a pattern of the mold has been transferred. The above-described article manufacturing method may be performed by using the imprint apparatus.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-166111 filed on Aug. 30, 2017, which is hereby incorporated by reference herein in its entirety.

What is claimed is:

1. A pattern forming apparatus that forms a pattern on a substrate, the apparatus comprising:
    a processing unit configured to perform a process of obtaining a position of a mark provided on the substrate by using a template for obtaining the position of the mark by being applied to optical information of the mark,
    wherein the processing unit decides a parameter indicating a shape of the template by performing reinforcement learning which updates the parameter so that a reward for an action of changing the parameter is increased.

2. The apparatus according to claim 1, wherein the processing unit
    obtains, based on the optical information of the mark, the position of the mark while changing the parameter for each of a plurality of substrates, and
    obtains the reward for evaluating the parameter from the position of the mark obtained for each of the plurality of substrates and decides the parameter such that the reward meets a criteria.

3. The apparatus according to claim 1, wherein the processing unit updates the parameter if the reward is larger than a previous reward.

4. The apparatus according to claim 1, wherein the processing unit decides the parameter for each of the marks provided in the shot regions of the substrates.

5. The apparatus according to claim 1, wherein the processing unit obtains a difference between an average value of the positions of the marks for the plurality of substrates before deciding the parameter and an average value of the positions of the marks for the plurality of substrates after deciding the parameter, and obtains an offset for correcting the difference.

6. The apparatus according to claim 1, further comprising a storage unit configured to store the optical information of the mark,
wherein the storage unit stores optical information of a new mark when a degree of similarity between the optical information of the new mark and stored information of the mark is equal to or less than a threshold.

7. The apparatus according to claim 1, wherein the processing unit decides the parameter while forming the pattern on the substrate.

8. The apparatus according to claim 1, wherein the reward is obtained by using a first degree of correlation between the template and a mark region where the mark exists in the optical information, and a second degree of correlation between the template and a peripheral region of the mark region in the optical information.

9. The apparatus according to claim 8, wherein the reward is obtained by using a sum total of the first degree of correlation for a plurality of substrates and a sum total of the second degree of correlation for the plurality of substrates.

10. The apparatus according to claim 8, wherein the reward increases as the first degree of correlation increases, and increases as the second degree of correlation decreases.

11. The apparatus according to claim 1, wherein the parameter includes a parameter indicating a position of a point forming the template.

12. The apparatus according to claim 1, wherein the processing unit decides the parameter for each of a plurality of shot regions of the substrate.

13. The apparatus according to claim 1, further comprising a detection optical system configured to obtain the optical information of the mark by detecting the mark.

14. A deciding method of deciding a parameter that is used for a process of obtaining a position of a mark provided on a substrate, and indicates a shape of a template applied to optical information of the mark, the method comprising:
obtaining the optical information of the mark by detecting the mark; and
deciding a parameter indicating a shape of the template by performing reinforcement learning which updates the parameter so that a reward for an action of changing the parameter is increased.

15. A non-transitory computer readable storage medium that stores a program for causing a computer to perform a deciding method of deciding a parameter that is used for a process of obtaining a position of a mark provided on a substrate, and indicates a shape of a template applied to optical information of the mark,
wherein the program causes the computer to execute
obtaining the optical information of the mark by detecting the mark, and
deciding the parameter by performing reinforcement learning which updates the parameter so as to increase a reward for an action of changing the parameter.

16. An information processing apparatus comprising:
a processing unit configured to decide a parameter that is used for a process of obtaining a position of a mark provided on a substrate, and indicates a shape of a template applied to optical information of the mark,
wherein the processing unit
obtains the optical information of the mark provided on each of a plurality of substrates by detecting the mark, and
decides the parameter by performing reinforcement learning which updates the parameter so as to increase a reward for an action of changing the parameter.

17. An article manufacturing method comprising:
forming, by using a pattern forming apparatus, a pattern on a substrate by obtaining a position of a mark on the substrate using a decided parameter and controlling a position of the substrate based on the obtained position of the mark;
processing the substrate on which the pattern has been formed in the forming; and
manufacturing an article from the processed substrate,
wherein the pattern forming apparatus includes
a processing unit configured to perform a process of obtaining a position of the mark by using a template for obtaining the position of the mark by being applied to optical information of the mark,
wherein the processing unit decides a parameter indicating a shape of the template by performing reinforcement learning which updates the parameter so as to increase a reward for an action of changing the parameter.

18. The method according to claim 17, wherein the pattern forming apparatus includes a detection optical system configured to obtain the optical information of the mark by detecting the mark.

19. A pattern forming apparatus that forms a pattern on a substrate, the apparatus comprising:
a detection optical system configured to obtain optical information of a mark provided on the substrate by detecting the mark; and
a processing unit configured to perform a first process of obtaining a position of the mark by using a template for obtaining the position of the mark by being applied to the optical information of the mark and a second process of obtaining a position of the mark by using a window which indicates a region for extracting an amount of characteristic indicating the position of the mark from a waveform signal obtained from the optical information,
wherein the processing unit decides, based on the optical information of the mark obtained by the detection optical system, a first parameter indicating a shape of the template and a second parameter indicating a shape of the window, for each of a plurality of substrates,
an accuracy of the position of the mark obtained by the first process is lower than an accuracy of the position of the mark obtained by the second process, and
the first parameter is determined under a condition different from the second parameter.

20. A pattern forming apparatus that forms a pattern on a substrate, the apparatus comprising:
a detection optical system configured to obtain optical information of a mark provided on the substrate by detecting the mark; and
a processing unit configured to perform a first process of obtaining a position of the mark by using a template for obtaining the position of the mark by being applied to the optical information of the mark and a second process of obtaining a position of the mark by using a window which indicates a region for extracting an amount of characteristic indicating the position of the mark from a waveform signal obtained from the optical information, wherein the processing unit decides, based on the optical information of the mark obtained by the detection optical system, a first parameter indicating a shape of the template and a second parameter indicating a shape of the window, for each of a plurality of substrates, an accuracy of the position of the mark obtained by the first process is lower than an accuracy of the position of the mark obtained by the second process, and the first parameter is decided for each shot region of the substrate, and the second parameter is decided for each of the marks provided in shot regions of the substrates.

21. A pattern forming apparatus that forms a pattern on a substrate, the apparatus comprising:

a detection optical system configured to obtain optical information of a mark provided on the substrate by detecting the mark; and a processing unit configured to perform a process of obtaining a position of the mark by using a template for obtaining the position of the mark by being applied to the optical information of the mark and a window which indicates a region for extracting an amount of characteristic indicating the position of the mark from a waveform signal obtained from the optical information, wherein the processing unit decides, based on the optical information of the mark obtained by the detection optical system, a parameter indicating at least one of a shape of the template and a shape of the window for each of a plurality of substrates, and obtains the position of the mark by using the decided parameter, wherein the processing unit obtains, based on the optical information of the mark obtained by the detection optical system, the position of the mark while changing the parameter for each of the plurality of substrates, and obtains an evaluation index for evaluating the parameter from the position of the mark obtained for each of the plurality of substrates and decides the parameter such that the evaluation index meets a criteria, wherein the processing unit obtains the evaluation index by using a sum total of degrees of correlation between the template and mark regions on the plurality of substrates where the marks exist, and a sum total of degrees of correlation between the template and peripheral regions of the mark regions on the plurality of substrates.

22. A pattern forming apparatus that forms a pattern on a substrate, the apparatus comprising:

a detection optical system configured to obtain optical information of a mark provided on the substrate by detecting the mark; and a processing unit configured to perform a process of obtaining a position of the mark by using a template for obtaining the position of the mark by being applied to the optical information of the mark and a window which indicates a region for extracting an amount of characteristic indicating the position of the mark from a waveform signal obtained from the optical information, wherein the processing unit decides, based on the optical information of the mark obtained by the detection optical system, a parameter indicating at least one of a shape of the template and a shape of the window for each of a plurality of substrates, and obtains the position of the mark by using the decided parameter, wherein the processing unit obtains a difference between an average value of the positions of the marks for the plurality of substrates before deciding the parameter and an average value of the positions of the marks for the plurality of substrates after deciding the parameter, and obtains an offset for correcting the difference.

23. A pattern forming apparatus that forms a pattern on a substrate, the apparatus comprising:

a processing unit configured to perform a process of obtaining a position of the mark by using a signal obtained from the optical information of the mark, wherein the processing unit decides a parameter indicating a weight applied to a value obtained from each of a plurality of regions in the signal by performing reinforcement learning which updates the parameter so that a reward for an action of changing a state defined by the parameter is increased.

24. The apparatus according to claim 23, wherein the reward is obtained by using a variation in size or position of the mark obtained from the amount of characteristic extracted from the window for a plurality of substrates.

25. The apparatus according to claim 24, wherein the reward is increased as the variation decreases.

26. The apparatus according to claim 23, further comprising a detection optical system configured to obtain optical information of the mark by detecting the mark.

27. An article manufacturing method comprising:

forming, by using a pattern forming apparatus, a pattern on a substrate by obtaining a position of a mark on the substrate using a decided parameter and controlling a position of the substrate based on the obtained position of the mark;

processing the substrate on which the pattern has been formed in the forming; and manufacturing an article from the processed substrate, wherein the pattern forming apparatus includes a processing unit configured to perform a process of obtaining a position of the mark by extracting an amount of characteristic indicating the position of the mark from a plurality of regions in a signal obtained from optical information of the mark, wherein the processing unit decides a parameter indicating a weight applied to a value obtained from each of the plurality of regions by performing reinforcement learning which updates the parameter so that a reward for an action of changing a state defined by the parameter is increased.

28. The method according to claim 27, wherein the pattern forming apparatus includes a detection optical system configured to obtain the optical information of the mark by detecting the mark.

* * * * *